United States Patent
Finger

(10) Patent No.: US 6,202,039 B1
(45) Date of Patent: *Mar. 13, 2001

(54) COMPACT, LOW-COST SEMICONDUCTOR DEVICE FOR RECEIVING ARBITRARY INPUT PARAMETERS AND DRIVING SELECTED DISPLAY DEVICES, AND METHODS

(75) Inventor: Eugene P. Finger, Brewster, NY (US)

(73) Assignee: Curtis Instruments, Inc., Mt. Kisco, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/963,989

(22) Filed: Nov. 4, 1997

Related U.S. Application Data

(63) Continuation-in-part of application No. 08/423,784, filed on Apr. 18, 1995, now abandoned.

(51) Int. Cl.[7] ..................................................... G09G 3/00
(52) U.S. Cl. ......................... 702/189; 702/127; 702/57; 345/30; 345/33; 345/35; 345/36
(58) Field of Search ............................... 364/550, 551.01, 364/712, 488–491, 485, 487; 257/370, 401; 395/921; 340/870.19, 870.24, 438, 459, 461, 525, 462, 501, 825.57; 324/76.12, 76.19, 166, 160, 161; 701/1, 14, 99, 102, 116, 123, 211; 345/519, 30, 33–36, 38–42, 44–46, 98; 702/57, 62, 64, 65, 66–68, 70, 73, 124, 126, 189, 190, 198, 127, 104, 188, 142, 145, 148, FOR 103, FOR 104, FOR 106, FOR 110, FOR 131, FOR 141, FOR 150; 700/260; 73/488–491, 495

(56) References Cited

U.S. PATENT DOCUMENTS

| | | | |
|---|---|---|---|
| 4,163,228 | * 7/1979 | Sadjadi | 345/30 |
| 4,470,011 | * 9/1984 | Masuda | 324/166 |
| 4,611,296 | * 9/1986 | Niedermayr | 700/260 |
| 4,630,043 | * 12/1986 | Haubner et al. | 340/825.57 |
| 4,687,300 | * 8/1987 | Kubo et al. | 345/34 |
| 4,831,558 | * 5/1989 | Shoup et al. | 702/188 |
| 4,845,649 | * 7/1989 | Eckardt et al. | 702/104 |
| 5,422,508 | * 6/1995 | Yilmaz et al. | 257/370 |
| 5,515,071 | * 5/1996 | Cho | 345/39 |
| 5,521,417 | * 5/1996 | Wada | 257/370 |
| 5,574,655 | * 11/1996 | Knapp et al. | 364/489 |

FOREIGN PATENT DOCUMENTS 0 330 347 A1 * 8/1989 (EP).
0 450 829 A1 * 10/1991 (EP).

OTHER PUBLICATIONS

CyberCell Designer's Manual, Hughes Semiconductor Products, pp. 1–3, 1–4, 1–13, 2–3, 4–3, 8–1–1,8–1–2, 9–1–1,9–1–2,10–1–1, Table of Contents for Chapter 7, 7–3 to 7–7, 1992 (no month).*

Lipman et al., Megacells: Augmenting Silicon Compilation For Asic Chip Design, Proceedings of the IEEE 1986 Custom Integrated Circuits Conference, May 12, 1986 to May 15, 1986, pp. 15–17.*

* cited by examiner

*Primary Examiner*—Hal Wachsman
(74) *Attorney, Agent, or Firm*—John H. Crozier

(57) ABSTRACT

In a preferred embodiment, a system of physical measurement and display of a parameter, including: accepting an input signal representative of a value of the parameter, the input signal having an arbitrary shape and amplitude; and displaying the value of the parameter in an arbitrary shape; including the use of analog and digital circuitry and non-volatile memory.

6 Claims, 35 Drawing Sheets

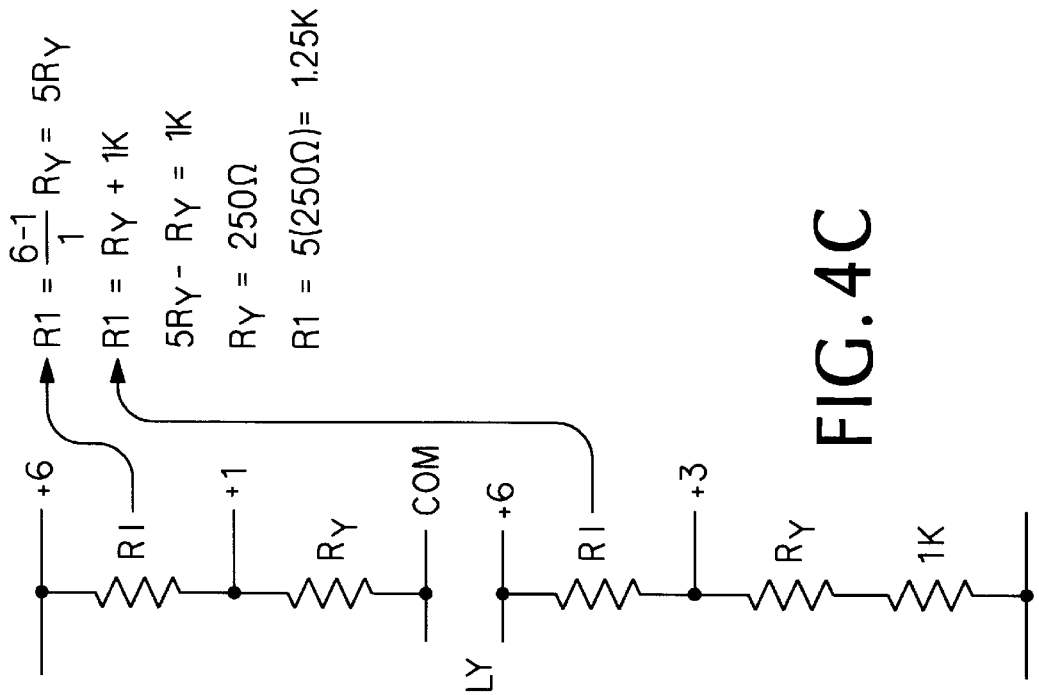
FIG. 4C
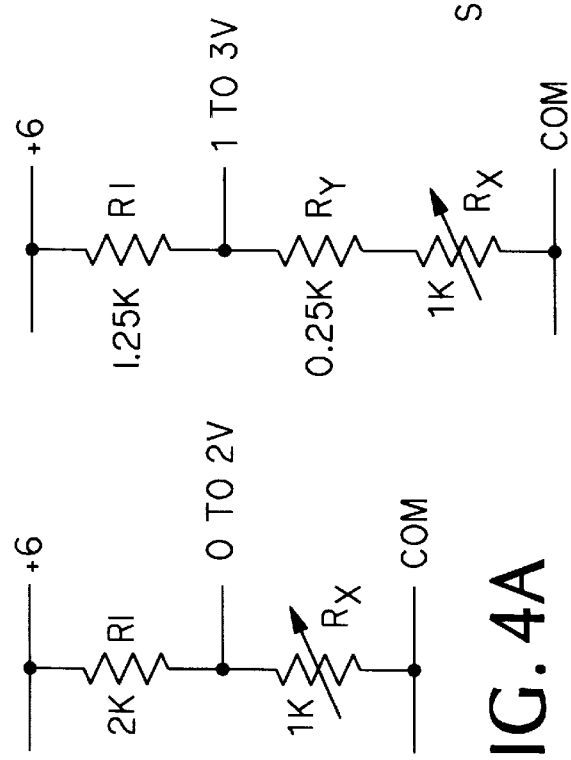
FIG. 4B
FIG. 4A

| PROGRAMMING AND CALIBRATION MEMORY MAP ||
|---|---|
| LOCATION(S) | DESCRIPTION |
| T11-1 THRU T11-8 | THRESHOLD T11 SEPARATES L00 AND L11, 8 BITS, 0 TO 255 |
| T22-1 THRU T22-8 | ″ T22 ″ L11 ″ L22 ″ ″ |
| T33-1 THRU T33-8 | ″ T33 ″ L22 ″ L33 ″ ″ |
| T44-1 THRU T44-8 | ″ T44 ″ L33 ″ L44 ″ ″ |
| T55-1 THRU T55-8 | ″ T55 ″ L44 ″ L55 ″ ″ |
| T66-1 THRU T66-8 | ″ T66 ″ L55 ″ L66 ″ ″ |
| T77-1 THRU T77-8 | ″ T77 ″ L66 ″ L77 ″ ″ |
| T88-1 THRU T88-8 | ″ T88 ″ L77 ″ L88 ″ ″ |
| T99-1 THRU T99-8 | ″ T99 ″ L88 ″ L99 ″ ″ |
| PR11, PR12 | UPPER FLASHER, 4 MODES |
| PR13, PR14 | LOWER FLASHER, 4 MODES |
| PR15, PR16 | UPPER OUTPUT, 4 MODES |
| PR17, PR18 | LOWER OUTPUT, 4 MODES |
| PR21 | SELECTS LED OR LCD DRIVE MODE |
| PR22 | SELECTS POINTER OR BARGRAPH MODE |
| PR23 | SELECTS RATIO OR ABSOLUTE MODE |
| PR24, PR25 | SLEW RATE, 4 RESISTANCE VALUES |
| PR26, PR27 | CONVERSION RATE, 4 TIME PERIODS |
| PR28 | SELECTS TRANSDUCER POWER MODULATION |
| CAL1, CAL2, CAL3 | CALIBRATES BANDGAP REFERENCE, 8 RESISTANCE VALUES |
| CAL4, CAL5, CAL6 | CALIBRATES 131 KHz OSCILLATOR, 8 R OR C VALUES |
| CAL7 | SELECTS NORMAL OR INVERT MODE |
| CAL8 | SELECTS 1 BIT HYSTERESIS OR NO HYSTERESIS |

FIG. 13

OUTPUT DRIVER TRUTH TABLE

| CONVERTED VALUES | | | | ACTIVE OUTPUT | |
|---|---|---|---|---|---|
| NORMAL MODE | | INVERTED MODE | | POINTER MODE | BARGRAPH MODE |
| EQUAL TO OR GREATER THAN | LESS THAN | EQUAL TO OR LESS THAN | GREATER THAN | | |
| ZERO PROTECTION LIMIT* | POSITIVE PROTECTION LIMIT* | POSITIVE PROTECTION LIMIT* | ZERO PROTECTION LIMIT* | L00 | L00 |
| T11 = 25 | T11 = 25 | T11 = 225 | T11 = 225 | L11 | L00 AND L11 |
| T22 = 50 | T22 = 50 | T22 = 200 | T22 = 200 | L22 | L00 THRU L22 |
| T33 = 75 | T33 = 75 | T33 = 175 | T33 = 175 | L33 | L00 THRU L33 |
| T44 = 100 | T44 = 100 | T44 = 150 | T44 = 150 | L44 | L00 THRU L44 |
| T55 = 125 | T55 = 125 | T55 = 125 | T55 = 125 | L55 | L00 THRU L55 |
| T66 = 150 | T66 = 150 | T66 = 100 | T66 = 100 | L66 | L00 THRU L66 |
| T77 = 175 | T77 = 175 | T77 = 75 | T77 = 75 | L77 | L00 THRU L77 |
| T88 = 200 | T88 = 200 | T88 = 50 | T88 = 50 | L88 | L00 THRU L88 |
| T99 = 225 | T99 = 225 | T99 = 25 | T99 = 25 | L99 | L00 THRU L99 |

FIG.19

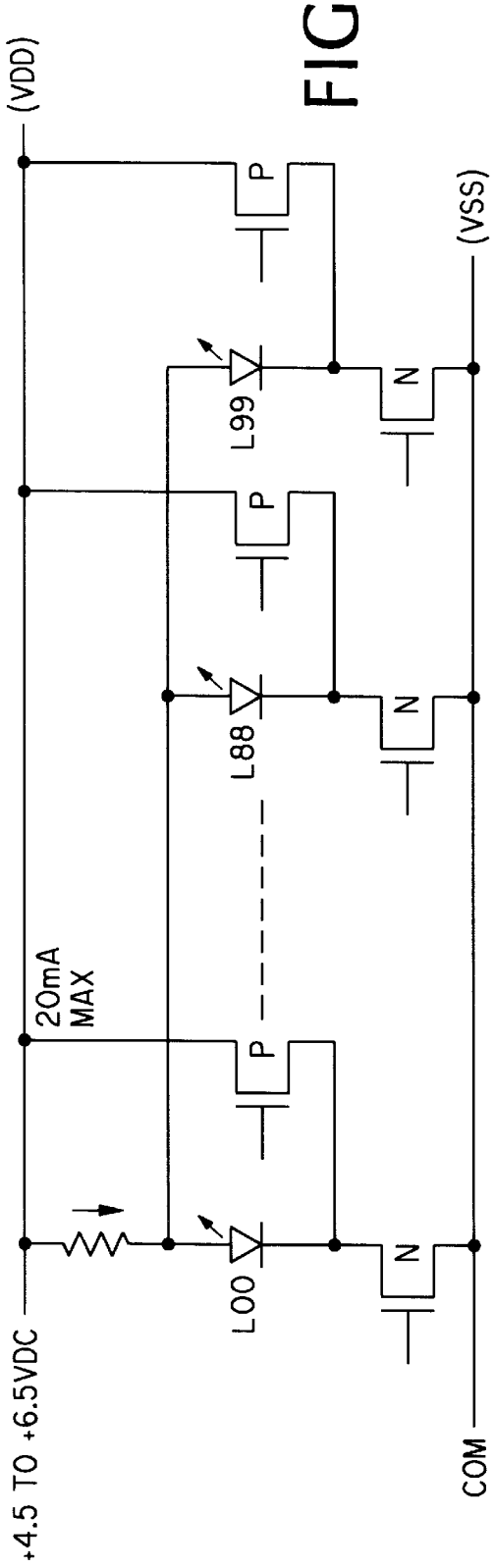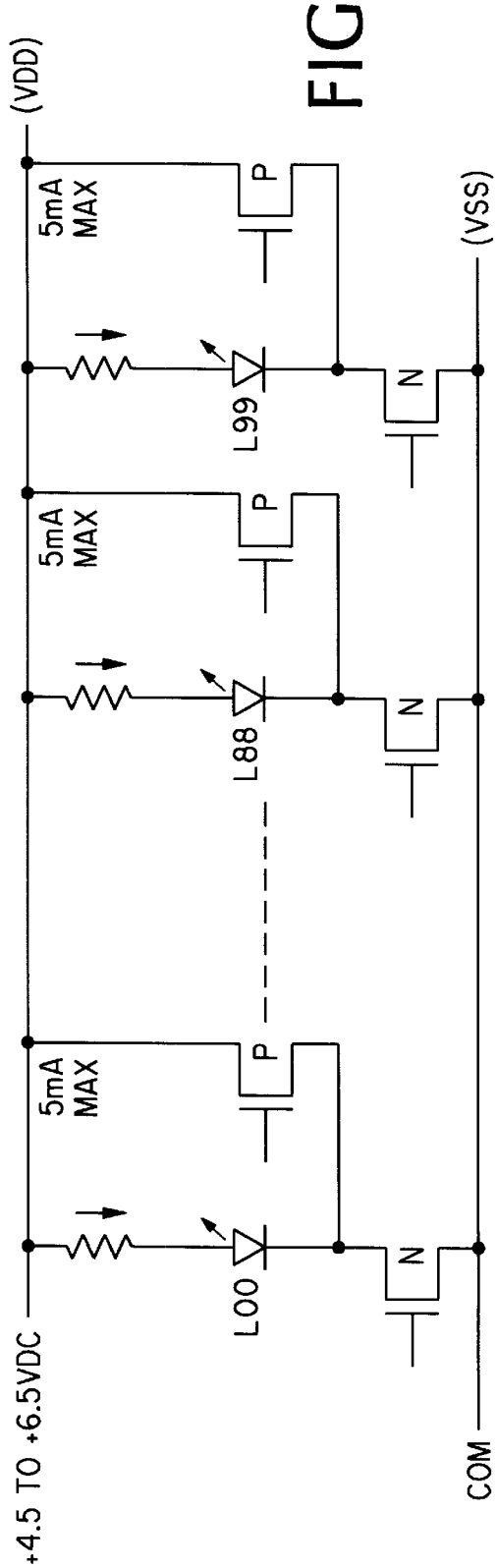

UPPER FLASHER TRUTH TABLE

| PR11 | PR12 | MODE DESCRIPTION | L99 PHASE | L88 PHASE |
|---|---|---|---|---|
| 0 | 0 | OFF | NO MODULATION | NO MODULATION |
| 0 | 1 | SINGLE FLASH (L99 ONLY) | C16 | NO MODULATION |
| 1 | 0 | DOUBLE FLASH IN-PHASE | C16 | C16 |
| 1 | 1 | DOUBLE FLASH OUT-OF-PHASE | C16 | $\overline{C16}$ |

FIG. 24

LOWER FLASHER TRUTH TABLE

| PR13 | PR14 | MODE DESCRIPTION | L00 PHASE | L11 PHASE |
|---|---|---|---|---|
| 0 | 0 | OFF | NO MODULATION | NO MODULATION |
| 0 | 1 | SINGLE FLASH (L00 ONLY) | C16 | NO MODULATION |
| 1 | 0 | DOUBLE FLASH IN-PHASE | C16 | C16 |
| 1 | 1 | DOUBLE FLASH OUT-OF-PHASE | C16 | $\overline{C16}$ |

FIG. 25

HI OUT TRUTH TABLE

| PRI5 | PRI6 | NORMAL STATE | ACTIVE ALARM STATE |
|---|---|---|---|
| 0 | 0 | 1 | 0 WHEN L99 IS ACTIVE |
| 0 | 1 | 1 | 0 WHEN L88 OR L99 IS ACTIVE |
| 1 | 0 | 0 | 1 WHEN L99 IS ACTIVE |
| 1 | 1 | 0 | 1 WHEN L88 OR L99 IS ACTIVE |

FIG. 26

LO OUT TRUTH TABLE

| PRI7 | PRI8 | NORMAL STATE | ACTIVE ALARM STATE |
|---|---|---|---|
| 0 | 0 | 1 | 0 WHEN L00 IS ACTIVE |
| 0 | 1 | 1 | 0 WHEN L00 OR L11 IS ACTIVE |
| 1 | 0 | 0 | 1 WHEN L00 IS ACTIVE |
| 1 | 1 | 0 | 1 WHEN L00 OR L11 IS ACTIVE |

SUMMARY OF RESHAPED TRANSDUCER-TO-OUTPUT TRANSFORM
FOR THE ASCENDING PRESSURE-TO-RESISTANCE EXAMPLE

| TRANSDUCER | | | XDCR IN | PROGRAMMED THRESHOLD | DECODED LEVEL | LED OUTPUT | |
|---|---|---|---|---|---|---|---|
| PSI | OHMS | Ω/PSI | VOLTS | | | ACTIVE | INDICATED PSI |
| 120 | 200 | +3.20 | 1.700 | (REF) 250 | ← | ← | 100 AND ABOVE 100 |
| 100 | 136 | +2.25 | 1.294 | T99 = 190 | L99 | RED | 85 TO 100 |
| 85 | 103.5 | +1.70 | 1.048 | T88 = 154 | L88 | YEL | 80 TO 85 |
| 80 | 95.0 | +1.50 | 0.979 | T77 = 144 | L77 | GRN | 75 TO 80 |
| 75 | 87.5 | +1.30 | 0.915 | T66 = 135 | L66 | GRN | 70 TO 75 |
| 70 | 81.0 | +1.14 | 0.859 | T55 = 126 | L55 | GRN | 65 TO 70 |
| 65 | 75.3 | +1.06 | 0.808 | T44 = 119 | L44 | GRN | 60 TO 65 |
| 60 | 70.0 | +1.00 | 0.760 | T33 = 112 | L33 | GRN | 55 TO 60 |
| 55 | 65.0 | +0.933 | 0.713 | T22 = 105 | L22 | GRN | 40 TO 55 |
| 40 | 51.0 | +0.775 | 0.577 | T11 = 85 | L11 | YEL | 40 TO 55 |
| 0 | 20 | +0.750 | 0.243 | (REF) 36 | L00 | RED | BELOW 40 |

FIG. 33

SUMMARY OF RESHAPED TRANSDUCER-TO-OUTPUT TRANSFORM
FOR THE DESCENDING TEMPERATURE-TO-RESISTANCE EXAMPLE

| °C | TRANSDUCER | | XDCR IN | PROGRAMMED | DECODED | LED OUTPUT | |
| --- | --- | --- | --- | --- | --- | --- | --- |
| | OHMS | Ω/°C | VOLTS | THRESHOLD | LEVEL | ACTIVE | INDICATED °C |
| 120 | 33 | -4.60 | 0.446 | (REF) 63 | ↑ | ↑ | 115 AND ABOVE 115 |
| 115 | 56 | -3.33 | 0.708 | T99 = 100 | L99 | RED | 100 TO 115 |
| 100 | 106 | -2.80 | 1.175 | T88 = 166 | L88 | YEL | 95 TO 100 |
| 95 | 120 | -2.40 | 1.286 | T77 = 182 | L77 | GRN | 90 TO 95 |
| 90 | 132 | -2.00 | 1.375 | T66 = 195 | L66 | GRN | 85 TO 90 |
| 85 | 142 | -1.80 | 1.446 | T55 = 205 | L55 | GRN | 80 TO 85 |
| 80 | 151 | -1.40 | 1.507 | T44 = 213 | L44 | GRN | 75 TO 80 |
| 75 | 158 | -1.20 | 1.552 | T33 = 220 | L33 | GRN | 70 TO 75 |
| 70 | 164 | -1.00 | 1.591 | T22 = 225 | L22 | GRN | 55 TO 70 |
| 55 | 179 | -1.60 | 1.682 | T11 = 238 | L11 | YEL | BELOW 55 |
| 0 | 396 | -7.60 | 2.560 | 255 (REF) LIMITED | L00 | YEL | |

| MEMORY MAP AND DESCRIPTIONS FOR FIG'S 28, 30 & 32 EXAMPLE | | | | | | | | | | | |
|---|---|---|---|---|---|---|---|---|---|---|---|
| LOCATIONS | DECIMAL | DESCRIPTION | 1 | 2 | 3 | 4 | 5 | 6 | 7 | 8 | |
| T111 - T118 | 85 | SEPARATES L00 AND L11 | 1 | 0 | 1 | 0 | 1 | 0 | 1 | 0 | T11 |
| T221 - T228 | 105 | SEPARATES L11 AND L22 | 1 | 0 | 0 | 1 | 0 | 1 | 1 | 0 | T22 |
| T331 - T338 | 112 | SEPARATES L22 AND L33 | 0 | 0 | 0 | 0 | 1 | 1 | 1 | 0 | T33 |
| T441 - T448 | 119 | SEPARATES L33 AND L44 | 1 | 1 | 1 | 0 | 1 | 1 | 1 | 0 | T44 |
| T551 - T558 | 126 | SEPARATES L44 AND L55 | 0 | 1 | 1 | 1 | 1 | 1 | 1 | 0 | T55 |
| T661 - T668 | 135 | SEPARATES L55 AND L66 | 1 | 1 | 1 | 0 | 0 | 0 | 0 | 1 | T66 |
| T771 - T778 | 144 | SEPARATES L66 AND L77 | 0 | 0 | 0 | 0 | 1 | 0 | 0 | 1 | T77 |
| T881 - T888 | 154 | SEPARATES L77 AND L88 | 0 | 1 | 0 | 1 | 1 | 0 | 0 | 1 | T88 |
| T991 - T998 | 190 | SEPARATES L88 AND L99 | 0 | 1 | 1 | 1 | 1 | 1 | 0 | 1 | T99 |
| PR21 | 1 | SELECTS LED MODE | 1 | 1 | 1 | 0 | 0 | 1 | 1 | 1 | PR1 |
| PR22 | 1 | SELECTS POINTER MODE | 1 | 1 | 1 | 0 | 0 | 0 | 1 | 0 | PR2 |
| PR23 | 1 | SELECTS RATIO MODE | 1 | 0 | 1 | 1 | 1 | 0 | 1 | 0 | CAL |
| PR24, PR25 | 0 | SELECTS FASTEST SLEW RATE (LOWEST FILTER TIME) | | | | | | | | | |
| PR26, PR27 | 2 | SELECTS THIRD (OF FOUR) CONVERSION RATE | | | | | | | | | |
| PR28 | 0 | SELECTS 1/2 POWER MODULATION | | | | | | | | | |
| PR11, PR12 | 3 | L88(YELLOW) AND L99(RED) DOUBLE FLASH OUT-OF-PHASE | | | | | | | | | |
| PR13, PR14 | 1 | L00 (RED) FLASHES | | | | | | | | | |
| PR15, PR16 | 2 | HI OUT GOES TO LOGICAL "0" WHEN L88 OR L99 IS ACTIVE | | | | | | | | | |
| PR17, PR18 | 3 | LO OUT GOES TO LOGICAL "1" WHEN L00 OR L11 IS ACTIVE | | | | | | | | | |
| CAL1-CAL3 | 5 | SELECTS THE SIXTH BANDGAP ADJUSTMENT | | | | | | | | | |
| CAL4-CAL6 | 3 | SELECTS THE FOURTH OSCILLATOR ADJUSTMENT | | | | | | | | | |
| CAL7 | 1 | SELECTS THE NORMAL MODE FOR TRANSDUCER TRANSFORM | | | | | | | | | |
| CAL8 | 0 | SELECTS NO HYSTERESIS | | | | | | | | | |

FIG. 34

COMPACT, LOW-COST SEMICONDUCTOR DEVICE FOR RECEIVING ARBITRARY INPUT PARAMETERS AND DRIVING SELECTED DISPLAY DEVICES, AND METHODS

CROSS-REFERENCE TO RELATED APPLICATION

U.S. application Ser. No. 08/633,423 is a continuation-in-part of application Ser. No. 08/423,784, filed Apr. 18, 1995, and titled COMPACT, LOW-COST, SEMICONDUCTOR DEVICE FOR RECEIVING ARBITRARY INPUT PARAMETERS AND DRIVING SELECTED DISPLAY DEVICES, AND METHODS, now abandoned.

BACKGROUND OF THE INVENTION

1. Field of the Invention

The present invention relates to the display of measured parameters generally and, more particularly, but not by way of limitation, to novel compact, low-cost, semiconductor device and methods for receiving arbitrary input parameters and driving selected display devices and methods therefor, which are particularly useful in motorized vehicles.

2. Background Art

Particularly in motorized vehicles, but not necessarily limited thereto, there is need for measuring and displaying physical parameters such as pressure, temperature, liquid level, voltage, and current and, in some cases, providing high and/or low indications thereof. Conventionally, almost all of these functions are satisfied by various electromechanical gauges which are relatively expensive and space-consuming. When high and/or low indication is required, auxiliary sensors and displays are frequently employed, as it is more economical to do so rather than derive the presence of an extreme condition from the normal measurement signal. Also, in order to accommodate the electromechanical display devices, the sensors must often be designed to be very non-linear, since the amount of freedom to shape the display device is quite limited. This latter factor introduces additional cost and space consumption to conventional systems.

It would be desirable to have a method and apparatus for physical parameter measurement and display which is particularly well suited for parameters such as pressure, temperature, liquid level, voltage, and current. There exists a wealth of inexpensive sensors and transducers which can provide electrical inputs to such a device. Unfortunately these transducers and sensors come in a very large number of electrical forms and non-linearities. It is, therefore, a first objective of the present invention to accept an arbitrary shape and, to some extent, arbitrary amplitude input signal.

It is very often desirable to contour the displayed information in order to shape, compress, or expand the parameter for ergonomic or resolution reasons. It is, therefore, a second objective of the invention to display the parameter in an arbitrary shape.

Many of the available inexpensive transducers and sensors have rather low impedances, requiring an excessive amount of power (in the context of the "micro-instrument" provided by the present invention). It is, therefore, a third objective of the invention to operate the mating transducer in one of several power conserving modes.

Some transducers are designed to provide an increasing output for an increasing physical parameter while others produce a decreasing output for an increasing input. It is, therefore, a fourth objective of the invention to treat the input in a normal (ascending) mode or an inverted (descending) mode.

In some cases the input signal comes from a calibrated source (e.g., absolute volts), but in other cases the input signal comes from a transducer which must be excited by the device (frequently in a power conserving mode). It is, therefore, a fifth objective of the invention to operate in either an "absolute" or "ratio" mode.

Some parameters are inherently jittery, or noisy (such as a fuel sender in a sloshing tank). It is, therefore, a sixth objective of the invention to provide varying degrees of damping or slew rate control. For example, relatively fast for pressure and voltage, or relatively slow for fuel level and temperature.

In critical applications, a second sensor is frequently introduced, as noted above, to warn or shut down an operation when an out-of-specification condition is detected. It is a seventh objective of the invention to provide a programmable over and/or under warning output.

In other critical applications, both a second and third sensor may be introduced to warn and/or shut down an operation when either a low or high out-of-specification condition is detected. It is, therefore, an eighth objective of this device to provide at least one additional programmable over and/or under warning output.

Most instruments designed for the vehicle market incorporate illumination. It is, therefore, a ninth objective of the invention to provide self-illumination by directly driving light-emitting diodes.

The light emitting diodes may be illuminated sequentially (pointer mode) or additively (bar graph mode). It is, therefore, a tenth objective of the invention to provide self-illumination in either of two modes, pointer or bar graph.

In some applications, such as portable battery operated equipment, it becomes necessary to run the device and transducer at very low power levels. It is anticipated that an inherently low power (or high impedance) transducer will be operated in one of the power conserving modes, and that the device will be operated in a direct drive LCD mode. In this mode a liquid crystal display may be driven without the need for temperature compensation over the temperature range of −40 degree C. to +85 degree C. It is, therefore, an eleventh objective of the invention to directly drive a liquid crystal display.

The LCD may be activated sequentially (pointer mode) or additively (bar graph mode). It is, therefore, a twelfth objective of the invention to provide low power LCD activation in either of two modes, pointer or bar graph.

Both the LED and LCD Display drives address individual segments. These segments may be arranged in limitless configurations; straight line vertical, straight line horizontal, straight line diagonal, curved up, curved down, patterns, matrices, etc. Two or more light emitting diodes can be simultaneously energized in series. Two or more LCD segments can be simultaneously energized in parallel. Static light emitting diodes can be energized directly, but static LCD segments require an AC drive signal. The static elements are envisaged as part of the scale legend or information, and are intended to be active whenever the power is applied. It is, therefore, a thirteenth objective of the invention to provide a continuously operating LCD segment driver.

The light emitting diodes can be assembled in specific color coded formats. For example, the traditional OK-Caution-Warning/Stop sequence of Green-Yellow-Red can be arranged within the display to impart that interpretation, while simultaneously "pointing" to the measured value. When coupled with scale expansion and contraction contouring the display can impart an unusually large amount of accurate information with relatively few display elements. It is, therefore, a fourteenth objective of the invention to provide color coded status information integral with the measurement.

When an out-of-specification condition is detected, it is often desirable to "flash" the display to draw attention to the fact that a problem exists. It is, therefore, a fifteenth objective of the invention to provide various flashing modes at the upper limits of the range or the lower limits of the range.

If an out-of-specification condition can occur at both extremes of the range, it may be desirable to "flash" the display for both conditions. It is, therefore, a sixteenth objective of the invention to provide various independent flashing modes at both the upper limits of the range and the lower limits of the range.

When information is known to vary at a slow rate, it may be desirable to limit the update of the display to rather long intervals to reduce apparent "flicker" when a borderline reading is made in a noisy environment. It is, therefore, a seventeenth objective of the invention to provide various conversion rate intervals. This will usually be used in conjunction with the slew rate control (objective six).

When information is known to be somewhat noisy, it may be desirable to introduce hysteresis to lessen the likelihood of borderline flicker. It is, therefore, an eighteenth objective of the invention to provide an hysteresis on/off feature. This will usually be used in conjunction with the conversion rate control (objective seventeen) and the slew rate control (objective six).

Having separate control over slew rate, conversion rate, and hysteresis allows for a large number of possibilities in solving the jitter and noise problems in systems with various response time requirements. Taken together they allow for ergonomic fine-tuning relative to the display, and/or warning response fine-tuning relative to the output signals.

The method and apparatus described herein has been architecturally optimized for a singe chip triple technology implementation (triple tech=analog, digital, and non-volatile memory in complementary MOS), on a particularly small and inexpensive die. The solution for the complete instrument must be cost competitive with the optimized evolved electromechanical gauges and their one hundred year market domination. It is, therefore, a nineteenth objective of the invention to be substantially integratable in a small, inexpensive, triple technology chip.

It is intended that one and only one chip serve all the instrumentation needs of a product line that will operate from numerous power sources, with innumerable transducers, displaying numerous transforms in either LED or LCD formats, with many functional options. Therefore, it is desirable that the invention will be programmable at the chip level via non-volatile memory, and at the circuit board level via "stuffing" instructions. Typical stuffing instructions will be resistor values for voltage options. Resistor values for classes of transducers, capacitor values for filter response, LED arrays for specific color formats, LCD assemblies for specific legend, etc. It is, therefore, a twentieth objective of the invention that all of the integratable options be programmed in non-volatile memory at the time of instrument manufacture. It should be noted that the vast percentage of applications will be satisfied with relatively few combinations of voltage, LED color assignment, and transducer "class". Therefore, very high level subassemblies could be stocked waiting for programming information that transforms them into any of thousands of option combinations.

The possibilities of transducer calibration for, say, resistive senders is huge, when accounting for absolute value, offsets, linearity, and direction (increasing versus decreasing). However, these can be conveniently lumped into broad classes of absolute value, say, two or three broad classes. When this is done via resistor stuffing at the subassembly level, it becomes a simple matter to fine tune the absolute value, adjust the offset, resolve the linearity relative to the desired display response, and assign the direction in non-volatile programming at this essentially "functionally complete" level of assembly.

Further elaborating on this "one chip for all" theme, it is the intention in this design to optimize the low power consumption of the chip without compromising the high current drive capability, or the size (cost) of the chip. It is, therefore, the twenty first objective of the invention to operate at a low quiescent current, while maintaining high current drive capability.

There are two areas of absolute reference on-chip generation that require discussion. The first is the time base, and the second is the voltage reference. A very low cost, but moderately accurate time base is needed to establish all internal clocking, analog-to-digital conversion, LCD drive waveforms, display flashers, non-volatile memory loading, non-volatile memory viewing, etc. A fully integrated R-C oscillator operating at 131 kiloHerz (after trimming) followed by binary counting chains conveniently produces 64 Herz for the LCD drivers and 2 Herz for the flashers (divided by $2^{11}$ and divided by $2^{16}$, respectively). A low cost band gap voltage regulator can be created in CMOS with fair temperature coefficients and curvature error, but poor absolute value. With trimming, the regulator error can be brought into acceptable limits.

It is, therefore, a twenty second objective of the invention to integrate a small, low-cost oscillator and trim this oscillator with instructions from the non-volatile memory, with these instructions initially inserted during wafer test, but re-written during final assembly, if required.

It is, further, a twenty third objective of the invention to integrate an efficient, small, low-cost band gap regulator and trim the regulator with instructions from the non-volatile memory, with these instructions initially inserted during wafer test, but re-written during final assembly, if required.

Other objects of the present invention, as well as particular features, elements, and advantages thereof, will be elucidated in, or be apparent from, the following description and the accompanying drawing figures.

This disclosure describes a display with ten (10) distinct states producing pointers, bar graphs, pictograms, icons, etc. The method can apply to any number of states, with 12, 15, 20, 25, etc., being quite practical. In every instance, the memorized thresholds will be one less than the number of display states. For example, 9 thresholds for 10 states and 24 thresholds for 25 states. It is, therefore, the twenty fourth objective of the invention to store in non-volatile, memory during the time of instrument manufacture a number of display states. Each of these thresholds will be stored digitally with a resolution commensurate with the desired accuracy and resolution of the analog-to-digital conversion process. It is, therefore, the twenty fifth objective of the invention to perform an analog-to-digital conversion process of sufficient accuracy and resolution to satisfy the stated instrument accuracy. Most often, the conversion process is expected to have resolutions of 6, 7, 8, 9, or 10 bits. This disclosure will focus on 8 bit examples, as they are quite appropriate for instrument applications in automotive and off-highway vehicles, motor/generator sets, motor/compressor sets, etc.

SUMMARY OF THE INVENTION

The present invention achieves the above objects, among others, by providing, in a preferred embodiment, a system of physical measurement and display of a parameter, comprising: accepting an input signal representative of a value of said parameter, said input signal having an arbitrary shape and amplitude; and displaying said value of said parameter in an arbitrary shape.

BRIEF DESCRIPTION OF THE DRAWINGS

Understanding of the present invention and the various aspects thereof will be facilitated by reference to the accompanying drawing figures, submitted for purposes of illustration only and not intended to define the scope of the invention, on which:

FIGS. 4A–4C are fragmentary schematic diagrams showing a method of changing the range of an input voltage signal.

FIG. 13 is table setting forth a programming and calibration memory map for the device of FIG. 8.

FIG. 19 is an output driver truth table for the semiconductor device.

FIGS. 20–22 are schematic diagrams showing output driver arrangements for use with various display elements.

FIG. 24 is an upper flasher truth table for the semiconductor device.

FIG. 25 is a lower flasher truth table for the semiconductor device.

FIG. 26 is a "HI OUT" truth table for the semiconductor device.

FIG. 27 is a "LO OUT" truth table for the semiconductor device.

FIG. 32 is a table presenting a summary of the complete transducer-to-output transform for the input described by FIGS. 28 and 30.

FIG. 33 is a table presenting a summary of the complete transducer-to-output transform for the input described by FIGS. 29 and 31.

FIG. 34 is a table presenting a memory map for the example of FIGS. 28, 30 and 32.

DETAILED DESCRIPTION OF THE PREFERRED EMBODIMENTS

Figure 1:
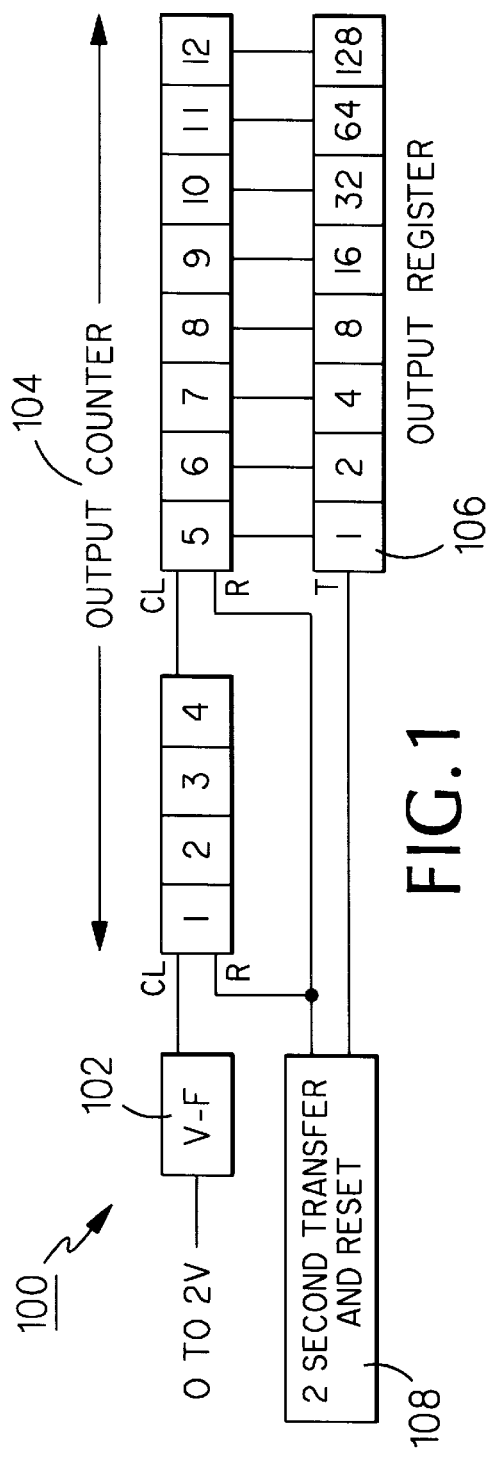
FIGS. 1–3 are block/schematic diagrams showing alternative analog-to-digital conversion circuits useful in the present invention.

Reference should now be made to the drawing figures, on which similar or identical elements are given consistent identifying numerals throughout the various figures thereof, and on which parenthetical references to figure numbers direct the reader to the view(s) on which the element(s) being described is (are) best seen, although the element(s) may be seen also on other views.

FIG. 1 illustrates an analog-to-digital converter, generally indicated by the reference numeral 100, which is employed as a participant in the filtering process in the present invention. Here, a voltage-to-frequency converter 102 operating over an input range of 0 to 2 volts and an output range of 0 to 2 kiloHerz followed by a 12-stage binary counter 104 is an excellent integrating analog-to-digital converter over, say a 2 second measurement interval, with 0 to 2 volts=0 to 2 kiloHerz=0 to 4000 counts over 2 seconds. This results in a 0 to 250 total in an output register 106 coupled to binary counter 104. Every 2 seconds, a transfer command is issued by transfer and reset circuitry 108 followed by a reset command. These commands are infinitesimal in duration relative to the integration interval (microseconds versus seconds). The interval is easily expanded or contracted, as well as the voltage-to-frequency conversion factor and the countdown stages, to produce very practical conversion (integration) intervals from tenths of seconds to hundreds of seconds. For example; an input range of 0 to 2.5 volts produces a voltage-to-frequency output of 0 to 1.25 kiloHerz followed by a 17-stage binary counter yielding the following states. 0 to 2.5 volts=0 to 1.25 kiloHerz=0 to 125,000 counts over 100 seconds. This results in a 0 to 244 total in the output register.

Figure 2:
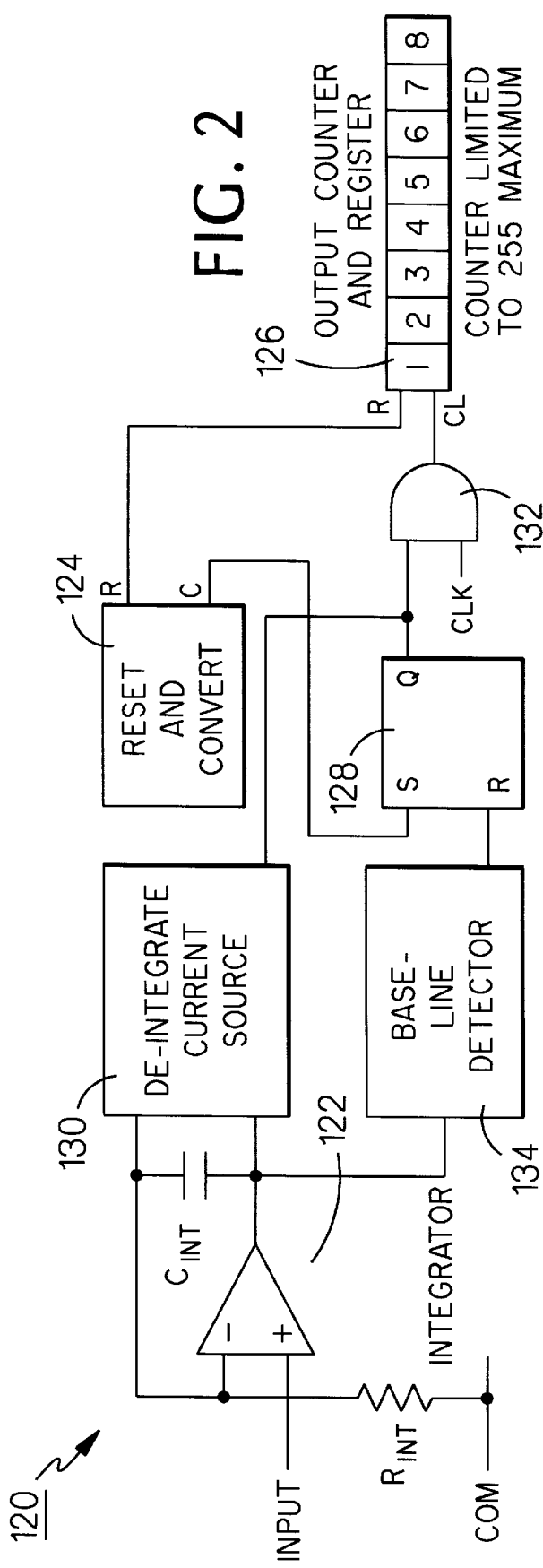

The integration over a predetermined interval may also be performed, as illustrated on FIG. 2, in the analog front end inherent within a dual slope analog-to-digital converter, generally indicated by the reference numeral 120. In this case the input voltage is integrated with respect to time over the desired interval within an analog integrator 122, and is then quickly de-integrated under time and counting control. Since the typical conversion will be on the order of 8 bits and the integrating interval will usually be on the order of seconds, the conversion can be kept simple by merely allowing the de-integrate current to overwhelm the input signal over an interval of, say, 1 millisecond, without concern for switching the input, or for creating any significant error. During the de-integrate interval, integrator 122 is continuously "up"-integrating in direct response to the input signal. When the time to convert occurs, say every 2 seconds, a reset command (R) is issued by reset and convert circuitry 124 to an output counter and register 126, followed immediately by a convert command (C) which sets a latch 128. Q of latch 128 goes to a logical "1" which activates the de-integrate current source 130 and enables the 250 kiloHerz clock (CLK) which will advance counter 126 through AND gate 132 over the 1 millisecond de-integrate interval required by a maximum input signal. A half-scale input would require 500 microseconds, yielding 125 counts, and so forth. When the output of integrator 122 reaches a "base-line" level a baseline detector 134 changes state, immediately resetting latch 128, thus stopping the flow of the de-integrate current and the counting in output counter/register 126. Baseline detector 128 may be conveniently set at 0.1 volt for the single positive power source example shown. In a plus-and-minus power supply system base line detector 134 may be conveniently set at 0.0 volts thus becoming a zero crossing detector.

The de-integrate current source 130 for integrator 122 is shown floating in analog-to-digital converter 120 on FIG. 2. That current source may be fixed against a power supply related reference by translating the input signal to a positive baseline in a single power supply system, thus allowing for bidirectional current flow into the integrator. For example; a normal 0-to-2-volt input signal can be translated to 1-to-3 volts and the input integrator and de-integrate current source can be modified simply as shown on FIG. 3 in which an analog-to-digital converter, generally indicated by the reference numeral 140 includes the same elements as analog-to-digital converter 120 shown on FIG. 2, with the addition of a +1.00-volt reference 142.

Figure 3:
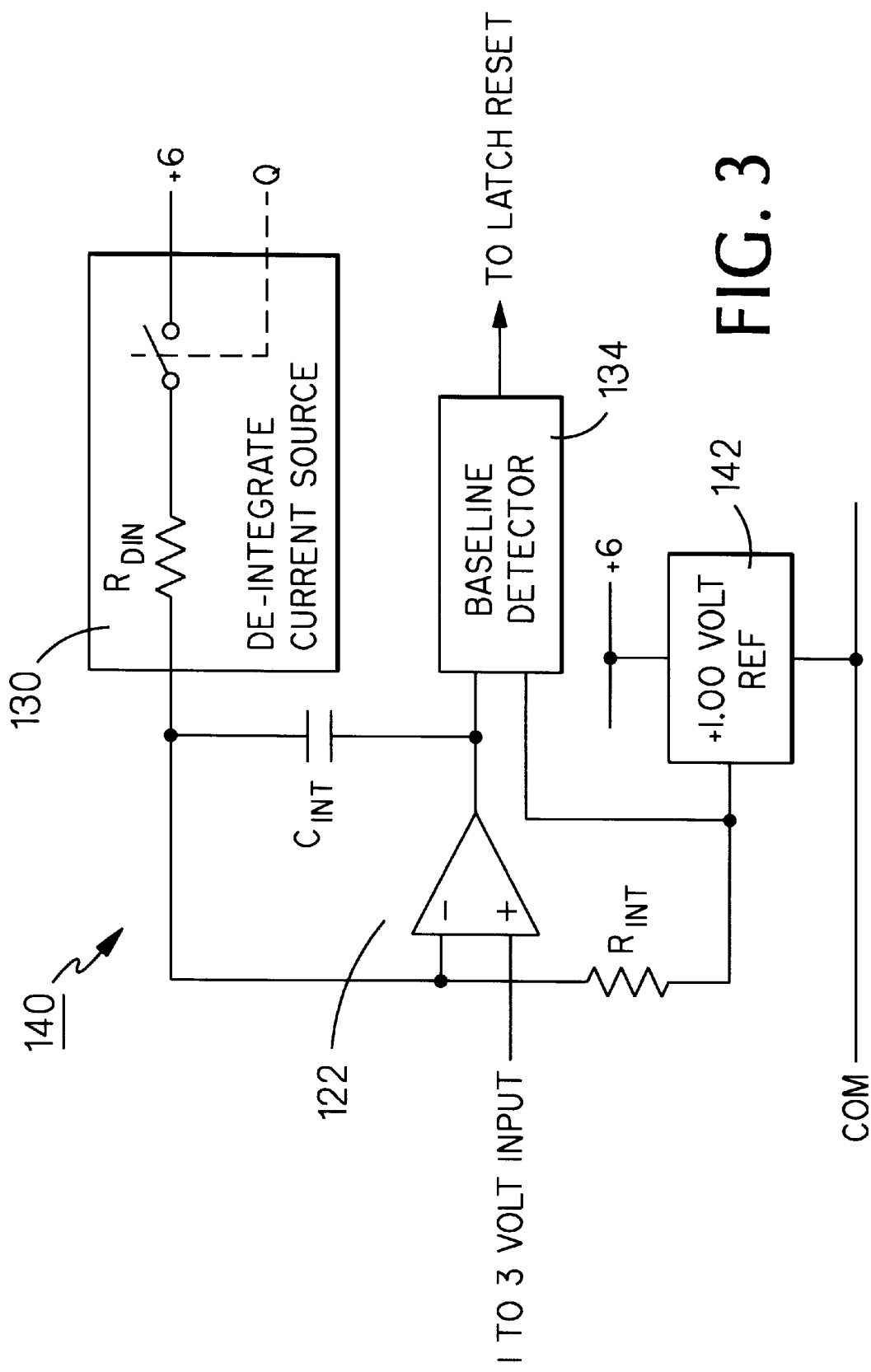

The following calculations illustrate some practical values for analog-to-digital converter 140 (FIG. 3). The assumptions are: the basic circuit power is +6.00 volts; the +1.00-volt reference is derived directly from the +6.00 volts; the input signal ranges from +1 to +3 volts; the conversion interval is 2.00 seconds; the integrating capacitor CINT is 1.00 microfarad; the range on the output of integrator 122 with the maximum input of 3 volts is 1 to 5 volts; the 1.00-volt lower limit is (arbitrarily) governed by baseline detector 134 with its 1.00-volt reference input; the 5-volt upper limit is controlled by component values; and de-integrate time=1 millisecond maximum.

(1) $Q = C\Delta E = 1 \times 10^6 (5-1) = 4$ micro-Ampere-seconds.

Integrator input current @ max. input voltage equals $(-4$ micro-Ampere-seconds$)/2$ seconds$=-2$ micro-Ampere.

(3) $R_{INT} = (1-3 \text{ volts})/(-2 \text{ micro-Amperes}) = -2/-2$ megOhms=1 megOhm.

(4) Integrator input current required to discharge the capacitor by 4 volts in 1 millisecond equals (+4 micro-Ampere-seconds)/0.001 second)=+4000 micro-Amperes=+4 milli-Amperes (See (6)).

(5) $R_{DIN} = (6-1)/4$ kilo-Ohms=1.25 kilo-Ohms (See (6)).

(6) Theoretically the de-integrate current must provide the 4 micro-Ampere-seconds discharge plus the (assumed) negligible input charge of 2 micro-Amperes for 1 millisecond=2 nano-Ampere-seconds. (4) and (5) then become 4.002 milli-Amperes and 1.24938 kilo-Ohms, respectively.

The following fragmentary schematics show one form of a simple translation from a 0-to-2-volt input (FIG. 4A) into a 1-to-3-volt input (FIG. 4B) for a 0-to-1000-Ohm resistive transducer, using the calculations indicated on FIG. 4C.

Figure 5:
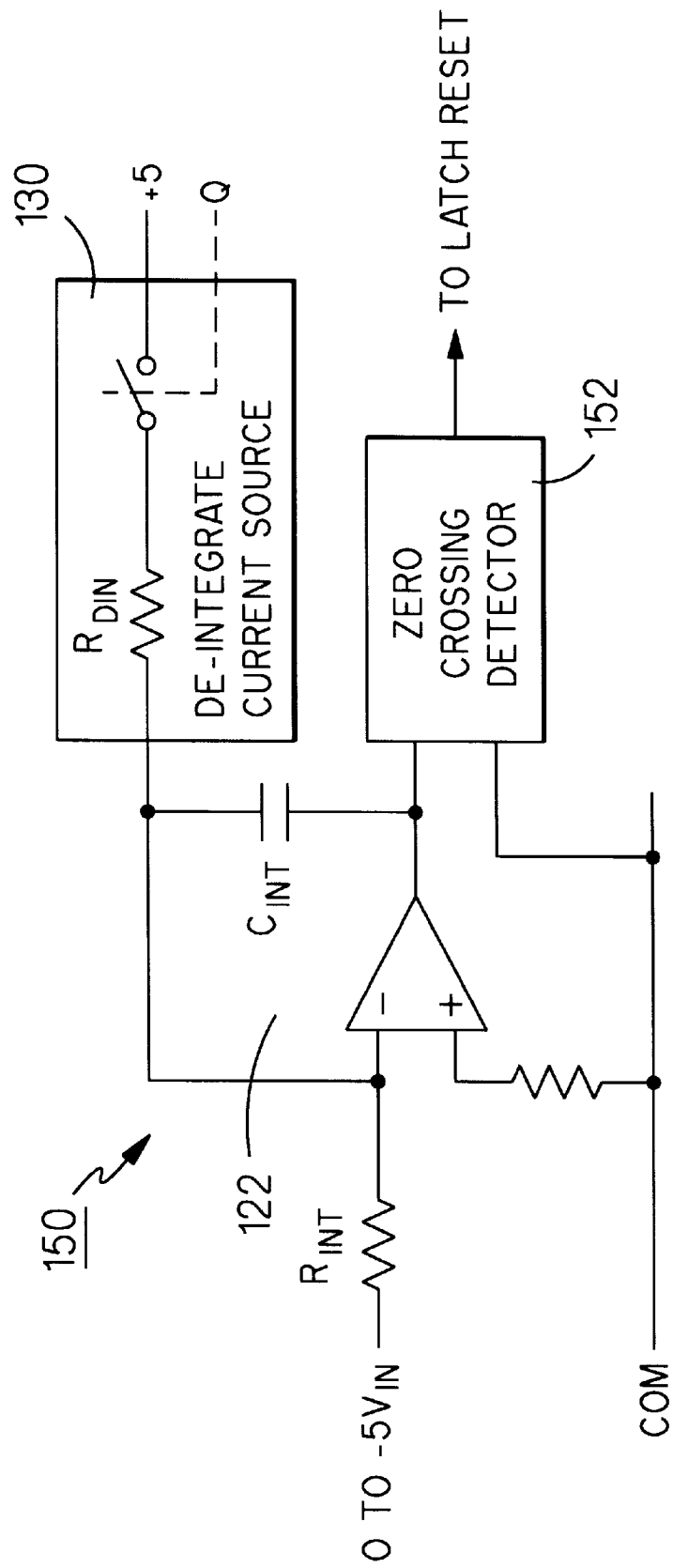
FIGS. 5–7 are block/schematic diagrams showing additional alternative analog-to-digital conversion circuits useful in the present invention.

If plus and minus power supplies are used, the integrator can be further simplified, especially if used with negative input signals. In its simplest form, it becomes the circuit shown below, generally indicated by the reference numeral 150, on FIG. 5, where $R_{INT}$ has been moved to the input and a zero crossing detector 152 replaces baseline detector 134 (FIGS. 2 and 3).

Figure 6:
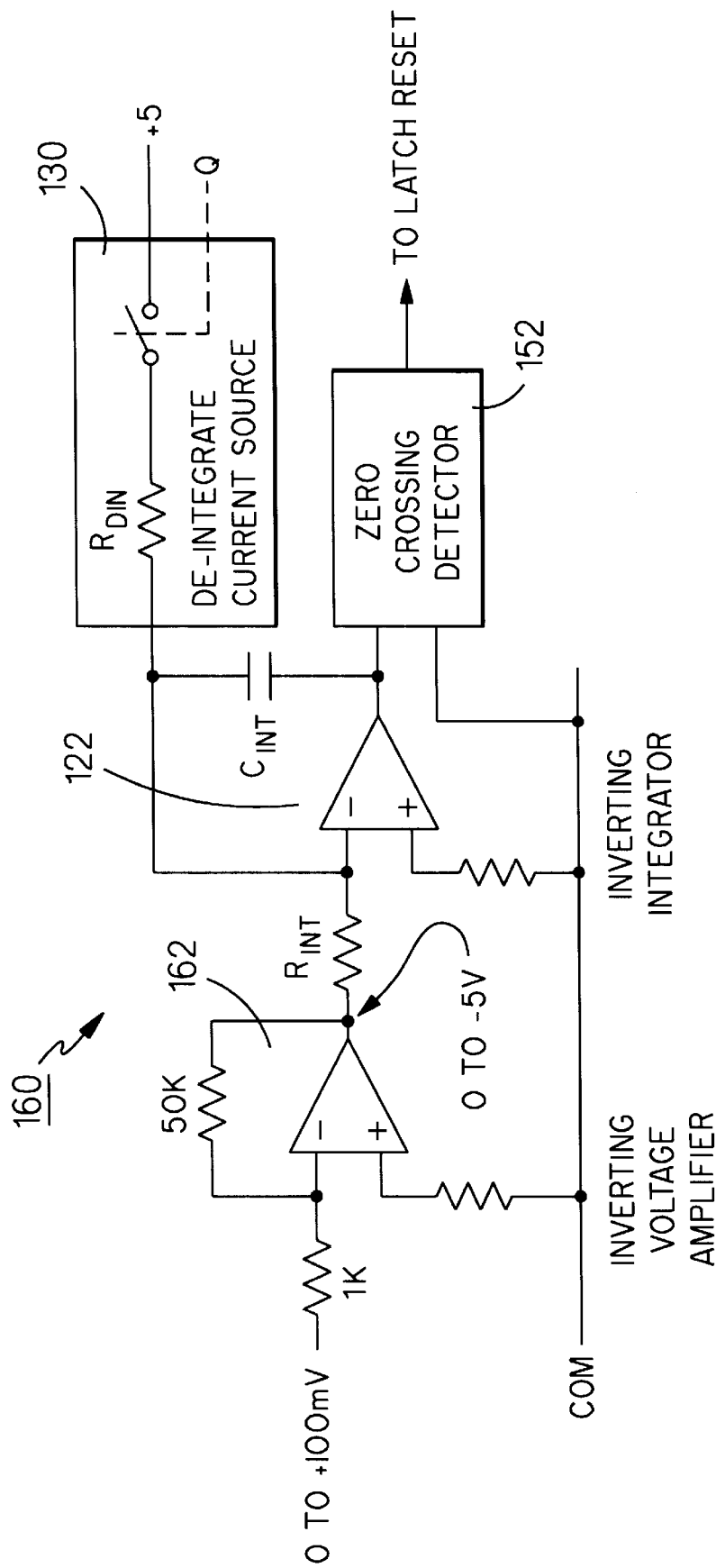

Usually, however, the input signals will be positive (and small, in this case) relative to common, and an inverting amplifier will be used ahead of the integrator. This is shown on FIG. 6 where an analog-to-digital converter, generally indicated by the reference numeral 160 includes an inverting voltage amplifier 162 in front of integrator 122. This can be advantageous when dealing with low level signals, where the input offset voltage performance of input amplifier 162 is best separated from the input offset current performance of integrator 122 (via the input amplifier's voltage gain).

Figure 7:
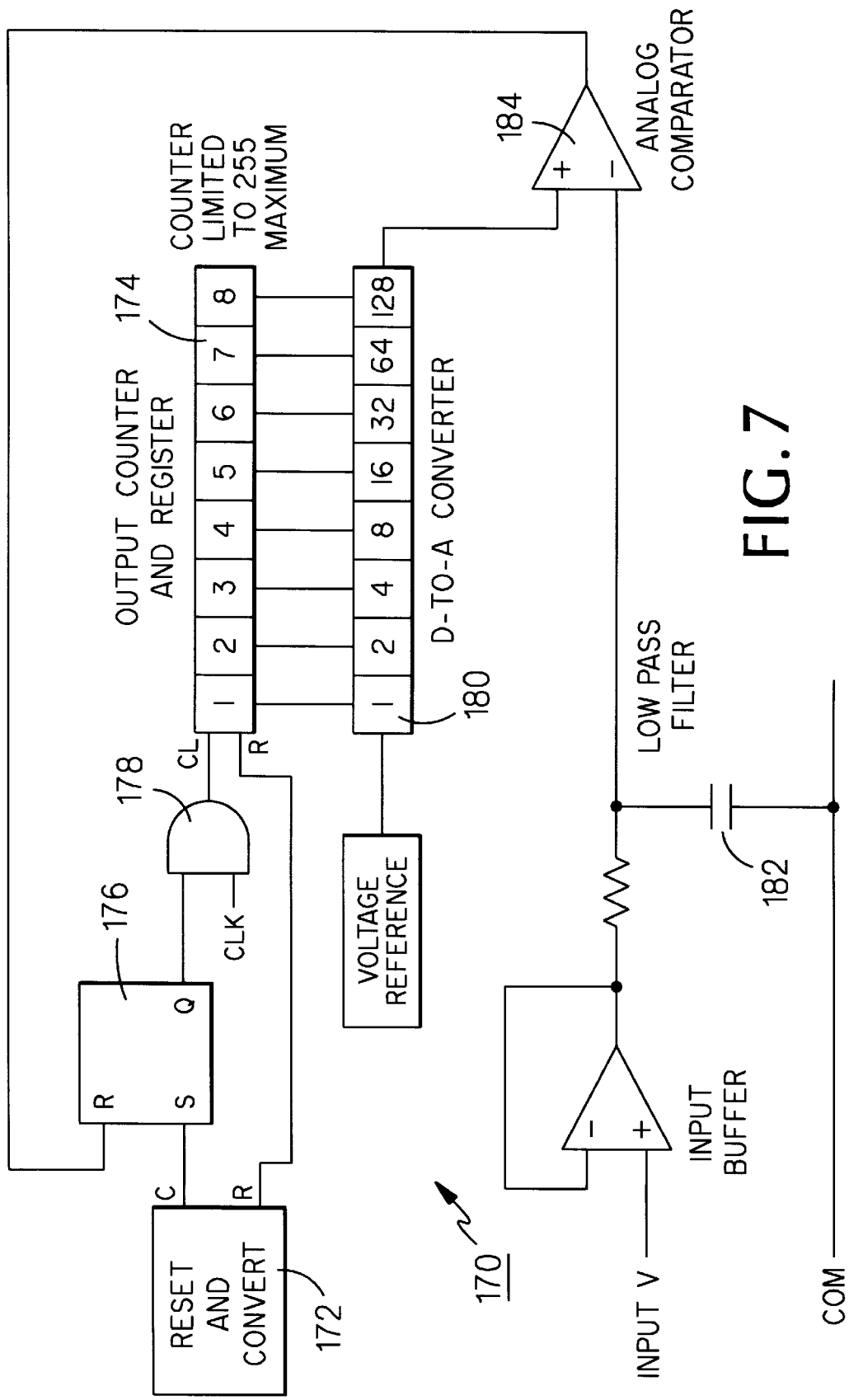

When the analog-to-digital converter is not a major participant in the filtering process, it can be simplified to become a digital-to-analog converter and analog comparator as shown in the circuitry illustrated on FIG. 7 and generally indicated by the reference numeral 170. The advantages are:

(1) Easy implementation in single chip integrated circuits.

(2) Relatively small circuit area.

(3) Independent of frequency error (depends on voltage REF only).

The disadvantage is, of course, that no integration (or filtering) is inherent in the conversion process and circuitry 170 is always intended to be used in conjunction with a filtered input.

When a conversion is requested (typically ½, 1, 2, 4, etc., seconds) a short reset command (R) from a reset and convert circuitry 172 resets an output counter, 174 and is followed immediately by a convert command (C) which sets latch 176. The set latch 176 enables a relatively fast clock (e.g. 131 kiloHerz) via AND gate 178. The counter counts up until the output from a digital-to-analog converter 180 exceeds the output from a low pass filter 182, at which time a comparator 184 changes state, resetting latch 176, and disabling the clock. The information in output counter 174 remains static until the next conversion interval, and it therefore serves as the output register for circuitry 170. The maximum conversion time for the example shown is 255× 7.6 microseconds=1.95 milliseconds. Meantime, the response of filter 182 could be several seconds (e.g., 1 megOhm and 2 microfarads=2 seconds), while the conversion rate could be 4 seconds, etc. Therefore,the conversion time could occupy less than 0.05% of the "update" period, eliminating the need for a separate output register. Counter 174 limits at 255 to prevent overflow.

Further simplification is possible by combining at least a portion of the level decoder with the digital-to-analog conversion process. If the digital-to-analog converter converts the sequential representation of the thresholds stored in memory, rather than an independent conversion, it could eliminate the need for the output counter and register and related clock and reset. When a conversion is required, the memory is read row-by-row, and is converted row-by-row, until the conversion is greater than (or less than, depending upon normal or invert selection) the filtered input signal. This level is then held until the next conversion is required.

FIG. 8 illustrates the circuitry on the semiconductor device of the present invention, generally indicated by the reference numeral 200. Device 200 includes the analog-to-digital conversion circuitry 170 (FIG. 7) which received an input signal from a transducer (not shown) at "XDCR IN" through an analog buffer 202 and an integrated switched resistor array 204. The output of circuitry 170 is fed to a level decoder 210 coupled to a drive mode generator 212 which provides display drive signals at a plurality of outputs, as at 214. Also on device 200 is a 96-bit non-volatile memory 220 the functions of which will be described below.

Figure 9:
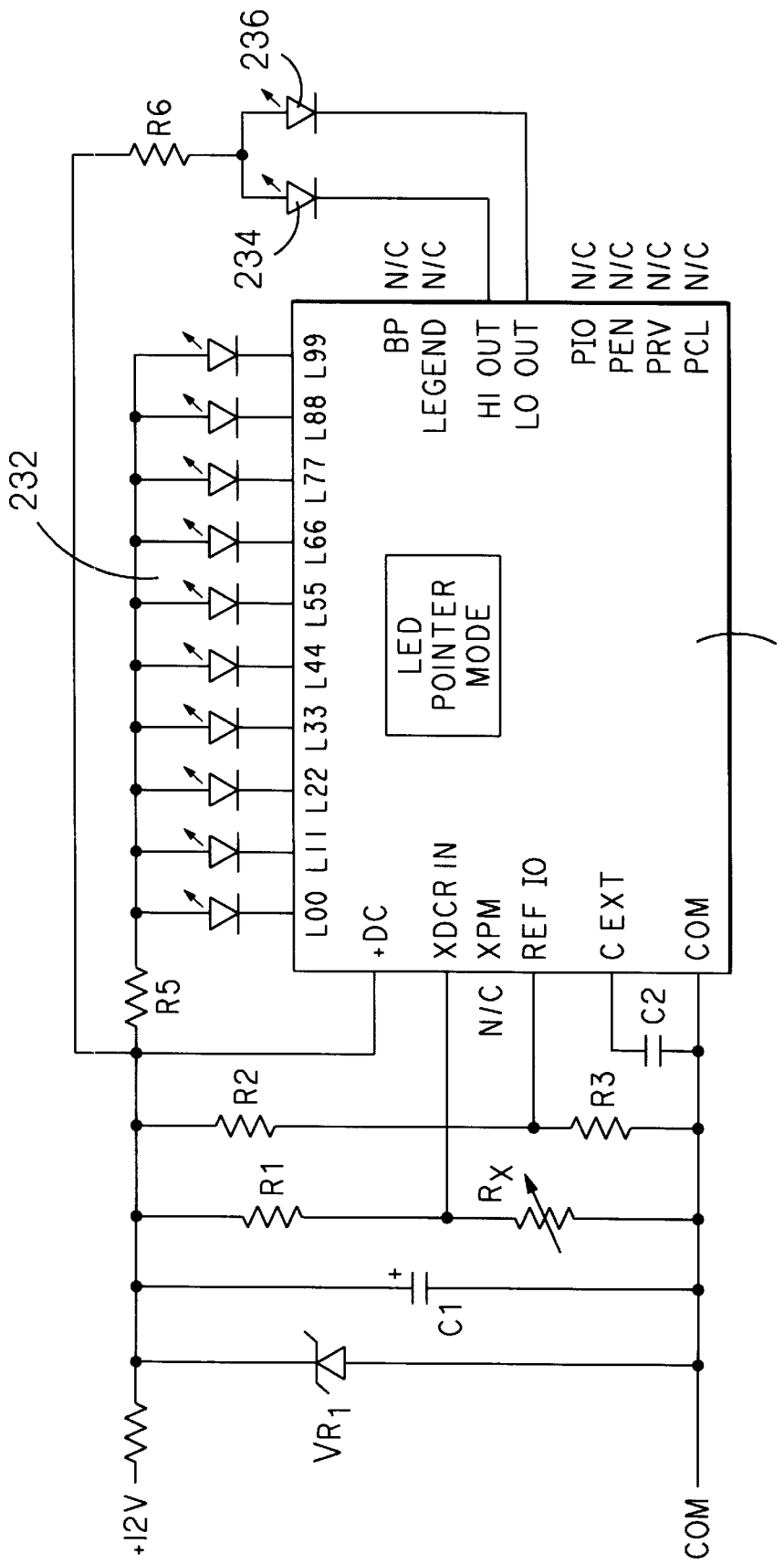
FIGS. 9–11 are block/schematic diagrams showing the device of FIG. 8 used with alternative display elements and with alternative input and out-of-tolerance indication arrangements.
Figure 10:
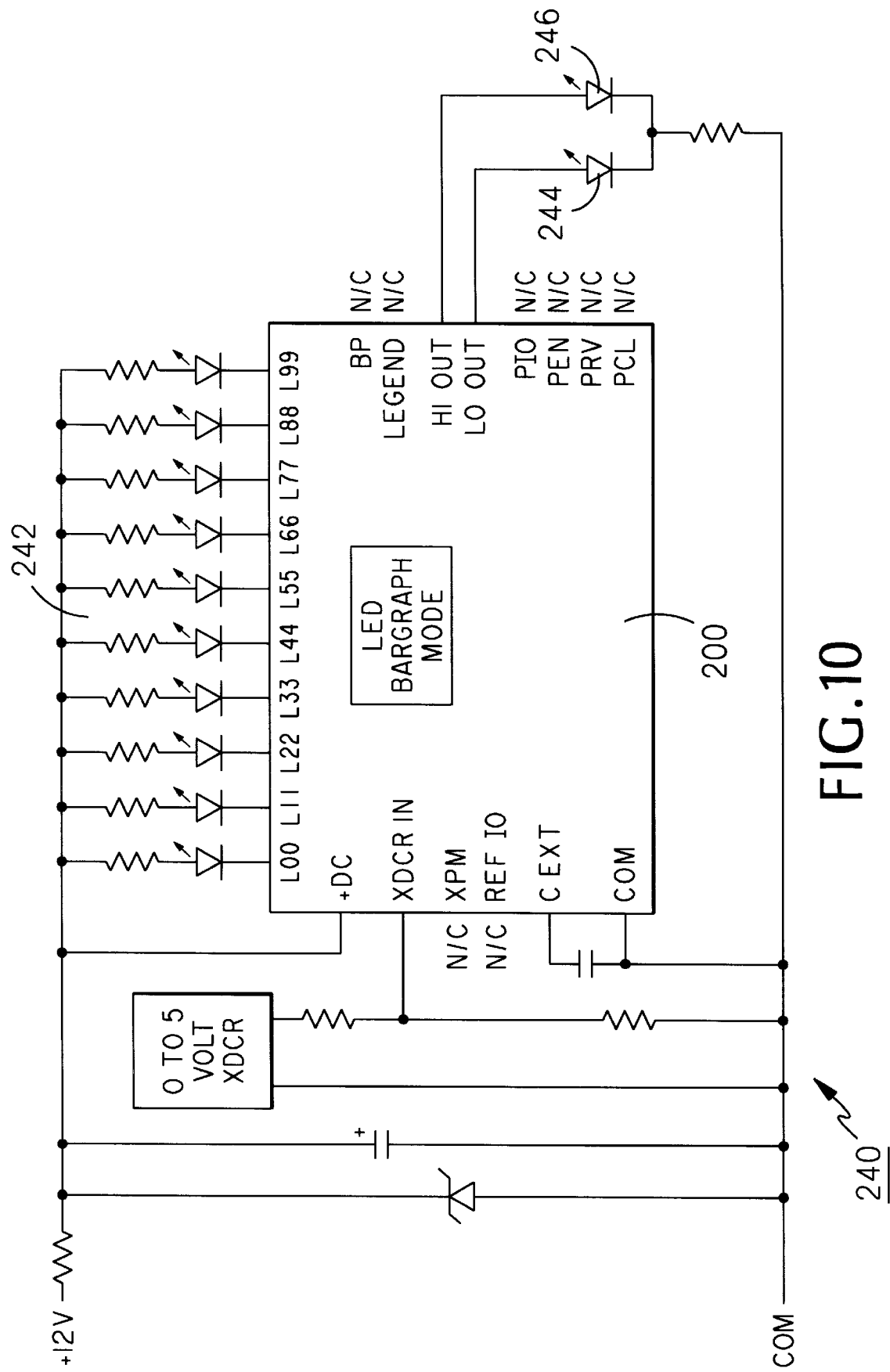
Figure 11:
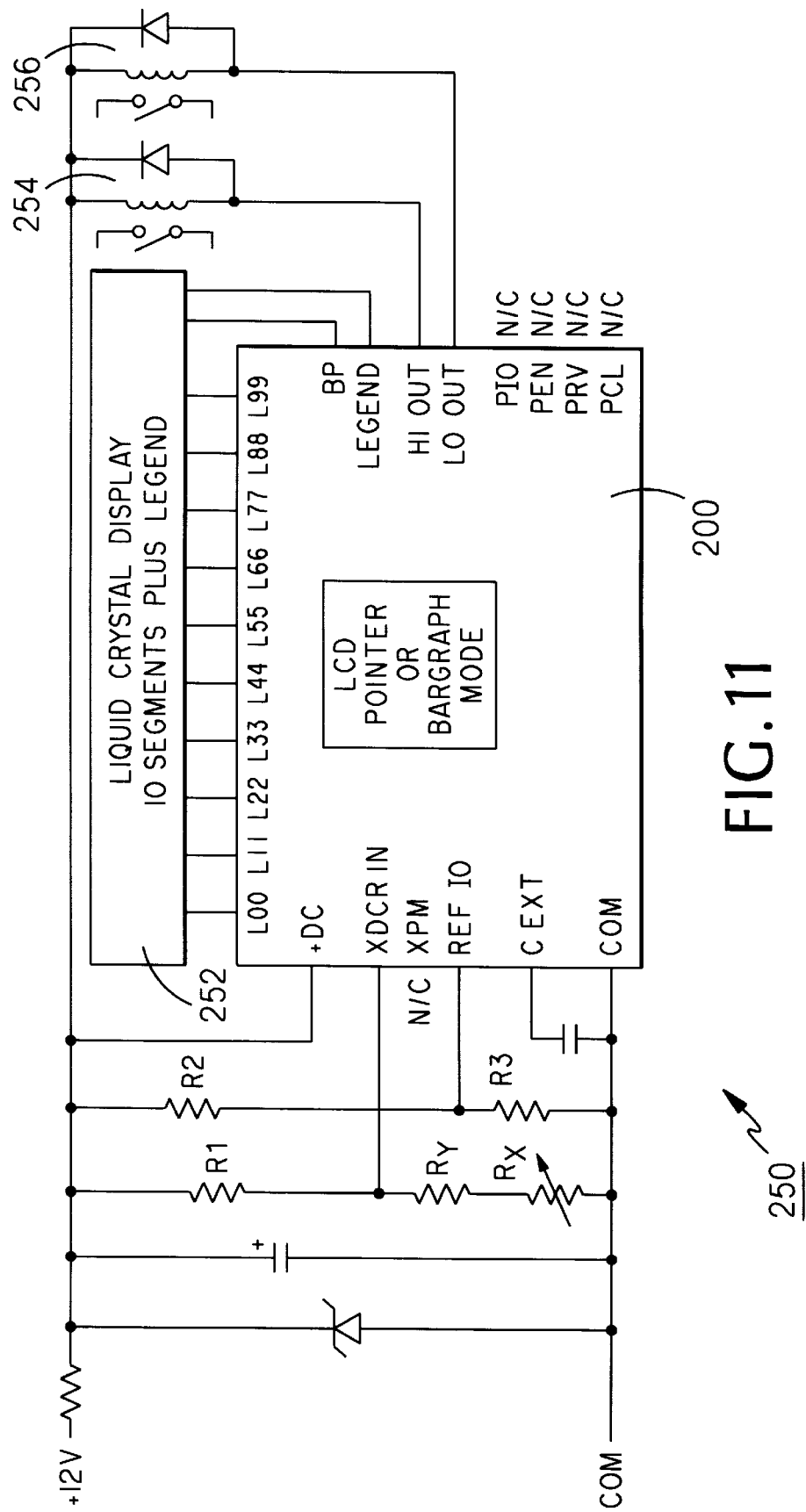
Figure 12:
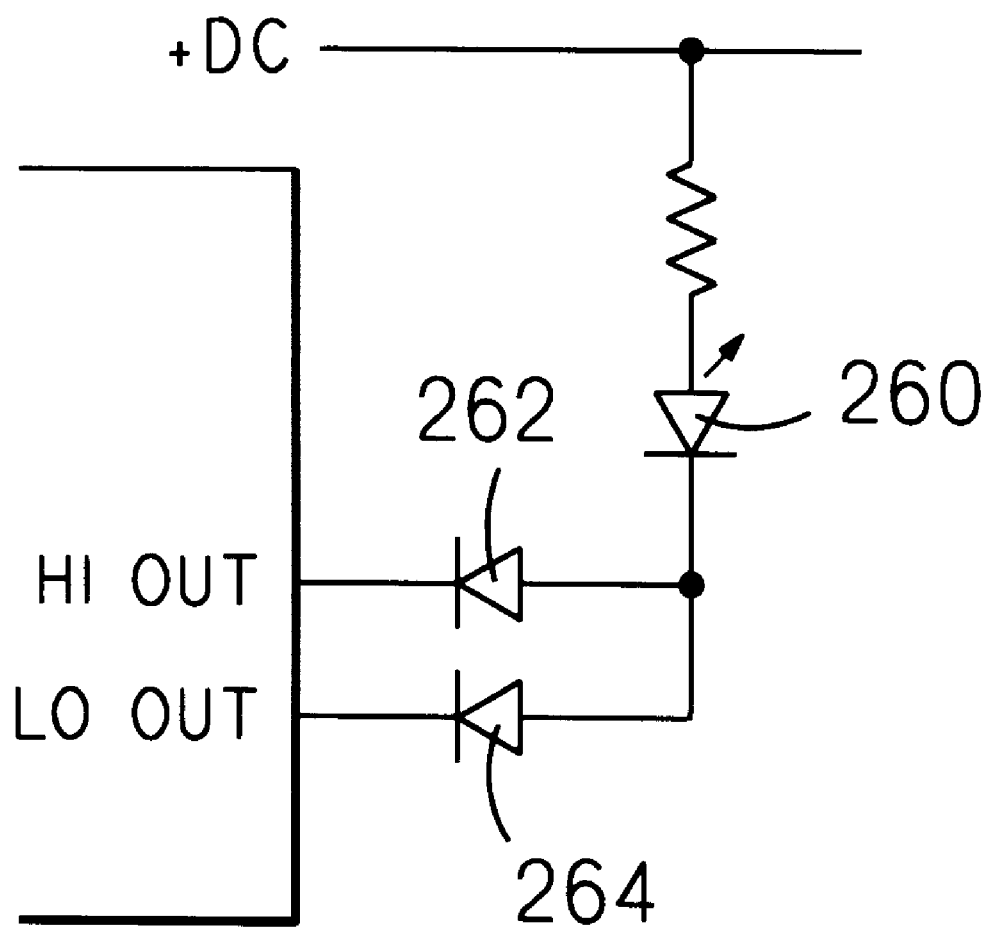
FIG. 12 is a fragmentary block/schematic diagram showing an alternative out-of-tolerance arrangement.

Illustrating the universality of semiconductor device 200, FIG. 9 shows the device combined with auxiliary circuitry to produce an instrument, generally indicated by the reference numeral 230, with a resistive transducer input, the transducer being represented by $R_x$. Device 200 drives a 10-segment LED display 232 in the pointer mode, and each of the warning outputs drives remote LEDs 234 and 236 in the pull-down mode. Power dissipation resistors R4A and R4B may be provided as a single, although slightly larger, resistor. FIG. 10 shows semiconductor device 200 combined with auxiliary circuitry to produce an instrument, generally indicated by the reference numeral 240, with a voltage input. Device 200 drives a 10 segment LED display in the bar graph mode, and each of warning outputs drive remove LEDs 244 and 246 in the pull-up mode. FIG. 11 shows semiconductor device 200 combined with auxiliary circuitry to produce an instrument, generally indicated by the reference numeral 250 with an offset zero resistive input, the offset being provided by resistor $R_y$. Device 200 drives a 10-segment plus legend LCD display 252 in either the printer or bar graph mode. The warning outputs of device 200 drive remote low power relays 254 and 256 in the pull-down mode, signaling separate high and low conditions. FIG. 12 shows an LED 260 "OR'd" in the pull-down mode, via diodes 262 and 264, with the single LED signifying an out-of-tolerance condition (high or low). This can be used in conjunction with 10-segment LED or LCD displays. The particular combinations of inputs, displays, and warning signals of instruments 230, 240, and 250 are for illustrative purposes only and any combination of the elements shown, as well as others may be provided within the intent of the present invention.

Referring back now to FIG. 8 and FIG. 13 together, the latter setting forth a programming and calibration memory map, an integrated oscillator 270 is calibrated during test by inserting one of eight trim possibilities into memory locations CAL4, CAL5, and CAL6. These control resistor and/or capacitor arrays in oscillator 270. The nominal 131-kiloHerz drives a long binary counter chain 272 which generates all of the system's sub clocks. The chain may proceed to even lower frequencies than the ¼ Herz (4 seconds) illustrated.

An integrated band gap voltage reference 280 is also calibrated during test by inserting one of eight trim possibilities via memory locations CAL1, CAL2, and CAL3. These control resistor arrays in voltage reference 280. The output from the reference is buffered by an analog amplifier 282 for internal and (on occasion) external use. Switch 284 at the output is under control of memory location PR23. When PR23 is a logical "1" the switch is closed and the semiconductor device is in the "absolute" mode where the reference to converter 170 is the trimmed absolute band gap reference. The signal present at "REF IO" is now an output and may be used as an auxiliary reference elsewhere within the completed instrument or system. When PR23 is a logical "0", switch 284 is open and device 200 is in the "ratio" mode where the reference to the converter 170 is provided from an external source.

The "XDCR IN" signal is buffered and filtered by analog buffer amplifier 202 and its output R-C low pass filter. Resistor array 204 portion is an integrated switched resistor array controlled by memory locations PR24 and PR25, allowing for four resistor possibilities. The capacitor portion is completed externally, and usually represents major jumps in time constants, while the resistors produce smaller steps (typically 15- or 20-to-1 for capacitor and 2-to-1 for resistor).

Non-volatile memory array 220 is a 96-bit (12 rows×8 columns) structure, rows 1 thru 9 store the nine thresholds, T11 thru T99, as 8-bit words to accommodate individual decimal numbers from 0 to 255. Rows 10 and 11 store individual programming bits or clusters of bits. Each bit is identified as PR1 followed by 1 thru 8, or as PR2 followed by 1 thru 8. Row 12 stores two clusters of calibration data (CAL1 thru CAL3, CAL4 thru CAL6) and two programming bits, CAL7 and CAL8. FIG. 13 summarizes the programming and calibration allocations. Each of these memory locations appear twice within the block diagram. First, within the memory array itself, and second at the function control location.

Data is loaded into memory 220 and examined coming out of memory via the bidirectional serial data port, PIO, 300. Each group of 8 data bits is accompanied by a 4-bit address in order to identify the related memory row. Three inputs and one output are involved in writing new data into the memory. PCL (programming clock) is the output and is derived from the main counter chain (C0 thru C19). The choice of frequency is somewhat arbitrary, but it is necessary as a synchronizer for the three inputs. Typically CX might be C6, C7, or C8. PEN is the programming enable input. It puts the PIO port into the input mode and enables a programming sequencer 302 when presented with a logical "1" PRV is the programming voltage input. The programming (and re-programming) of memory 220 requires voltages outside of the normal power supply regime. In order to maintain maximum cost effectiveness for semiconductor device 200, the normal on-chip programming voltage generation is moved off-board; especially beneficial in light of the fact that programming may often be a one-time manufacturing operation.

Programming sequencer 302 moves through an orderly erase and write sequence under timekeeping from clock CY which, of course, is related to CX. It issues instructions to erase, write, and advance through the rows, via time and voltage control.

Conversion rate is programmed for one of four rates depending upon the application's needs. Memory locations PR26 and PR27 control the selection. In this example the rates may be ½ second, 1 second, 2 seconds, or 4 seconds.

For longer practical conversion times which may be employed, i.e., 8–16 seconds, the thermal time constants for all components are such that effects of temperature are insignificant. The time constants are on the order of minutes, so the time averaging scheme makes any temperature ripple due to thermal effects virtually unnoticeable.

Figure 14:
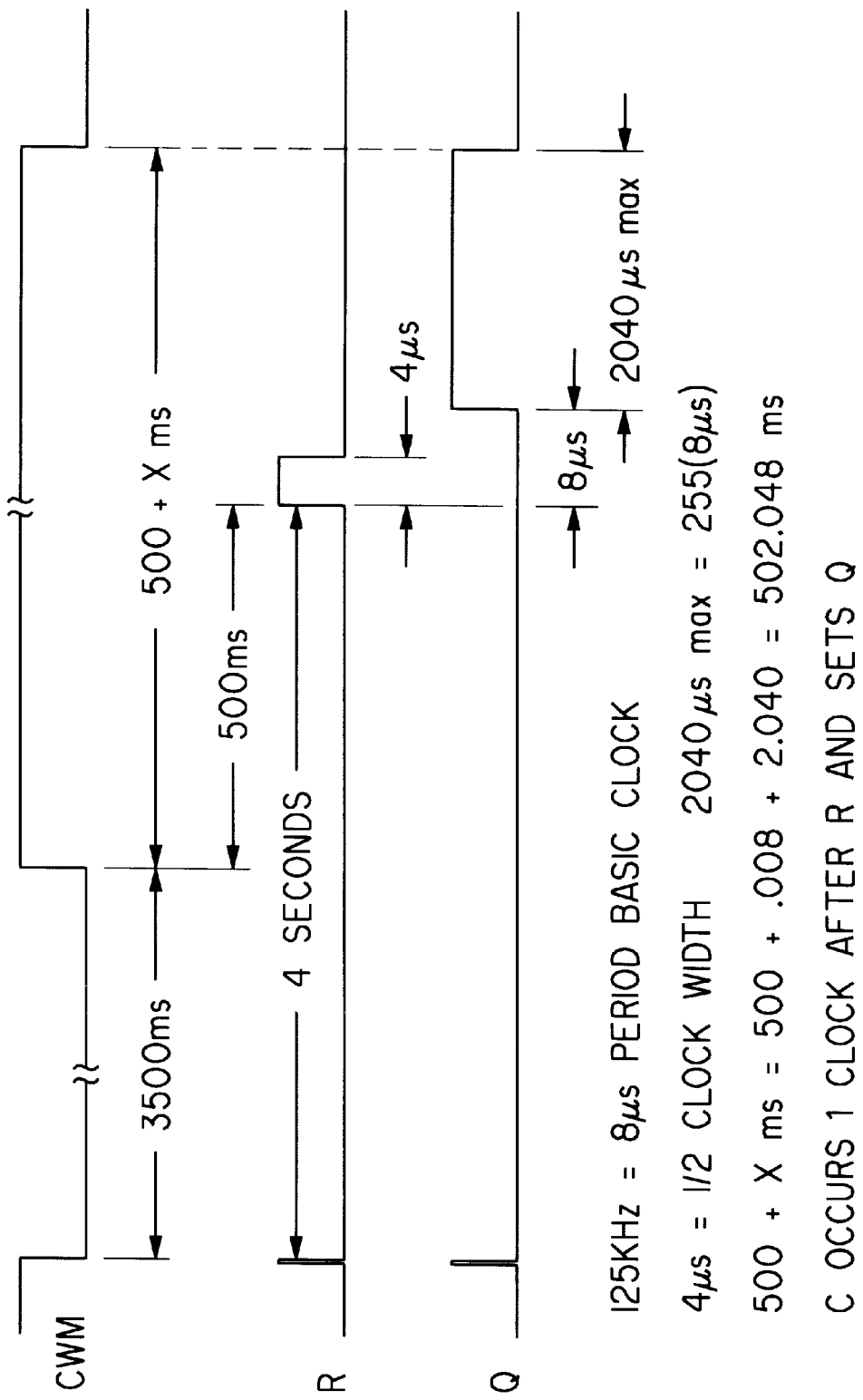
FIG. 14 illustrates a typical timing sequence for the analog-to-digital conversion circuit of the semiconductor device.

Control over conversion rate is usually dictated by ergonomic and/or signal noise/jitter considerations; however, it can be functionally extended to assist in transducer power conservation. In the extreme case of a 0-to-100-Ohm transducer in series with a 100-Ohm bridge resistor with 5-volt bridge excitation, the worst case current will be 50 milli-Amperes. If this current must be supplied within the instrument from, say, 15 volts (high float charge voltage of a 12-volt DC system) the maximum power will be 750 milliwatts. This may be beyond the thermal capacity of a "micro-instrument". If this power could be modulated to ½ or even ⅛, the time-averaged transducer excitation load would reduce to 375 or 94 milliwatts, respectively. PR28 controls the conversion width modulation (CWM) output from a conversion rate selector 310 to energize a transducer just before measurement, thereby to conserve power. When PR28 is a logical "1", the CWM output is active for the last ½ of the conversion period. When PR28 is a logical "0" the CWM output is active for the last ⅛ of the conversion period. FIG. 14 shows a typical timing sequence (on a variable time base scale) for a 4-second conversion with ⅛ duty cycle (PR28=0).

Figure 8A:
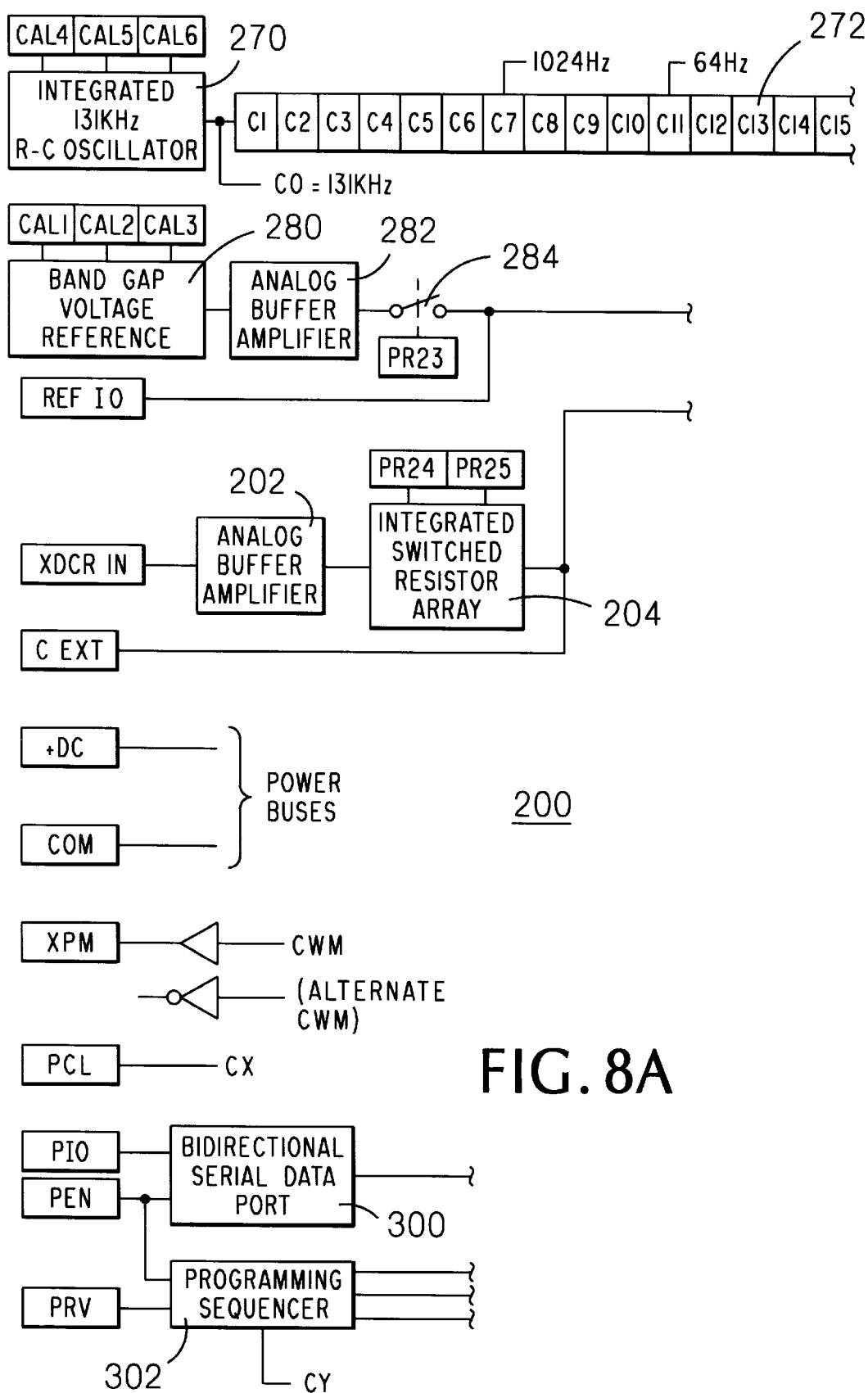
FIGS. 8A–8C are block/schematic diagrams showing the circuitry of the semiconductor device of the present invention.
Figure 8B:
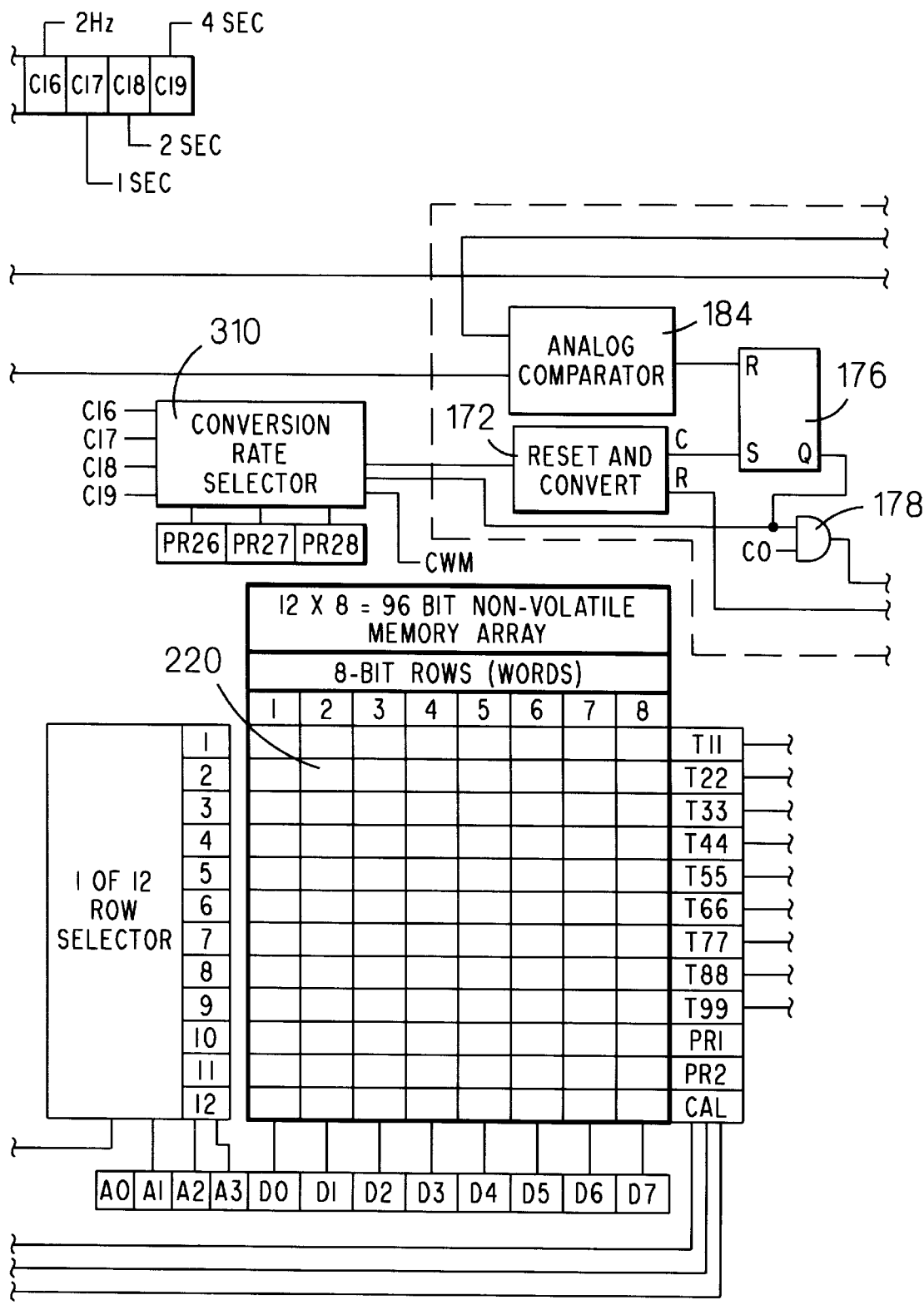
Figure 8C:
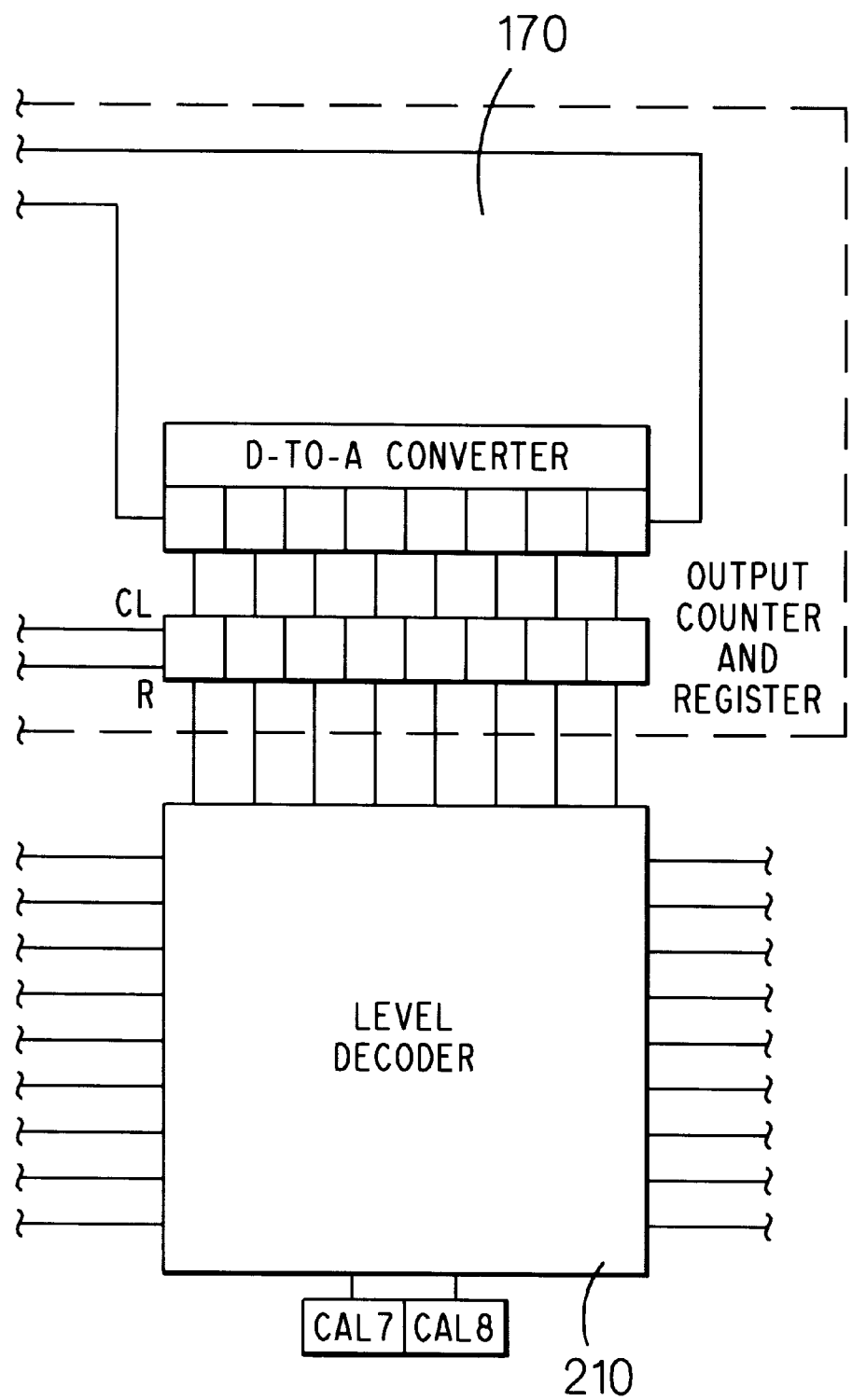
Figure 8D:
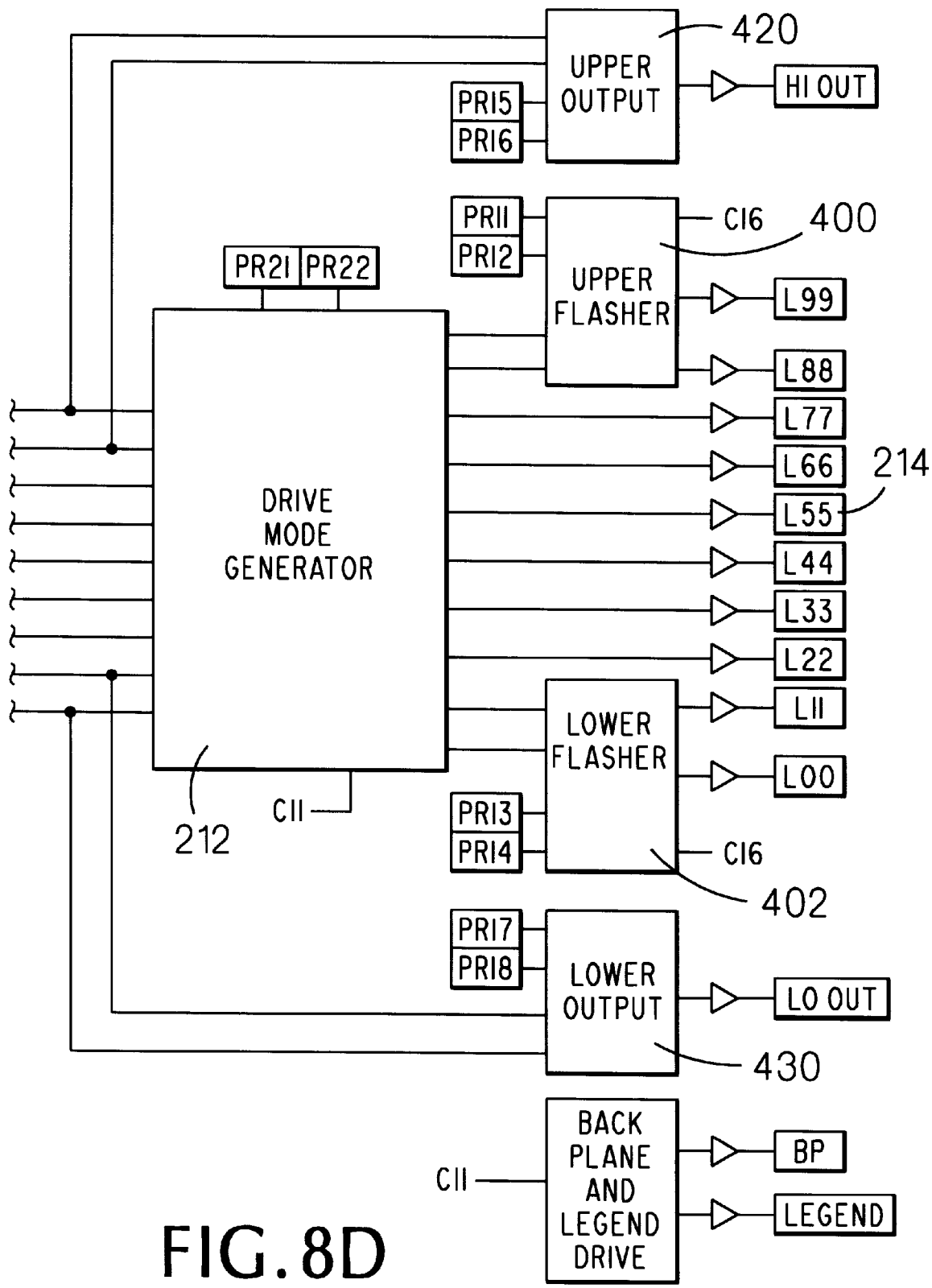
FIG. 8D shows the arrangement of FIGS. 8A–8C for the reading thereof.
Figure 8E:
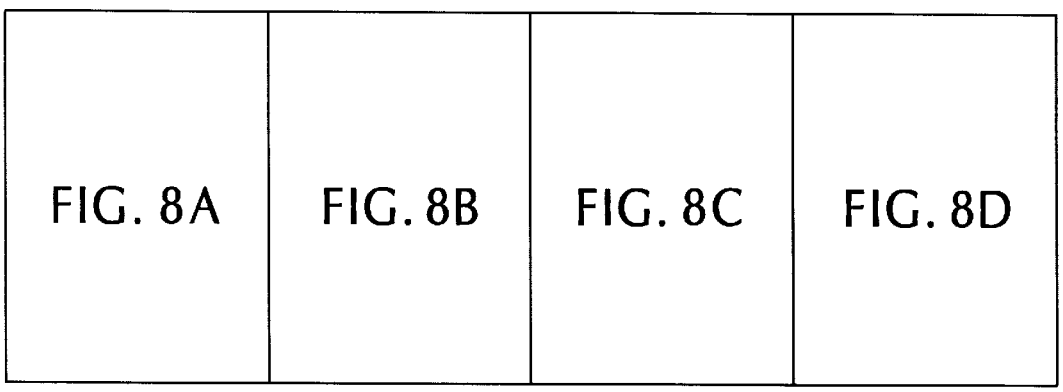
Figure 15:
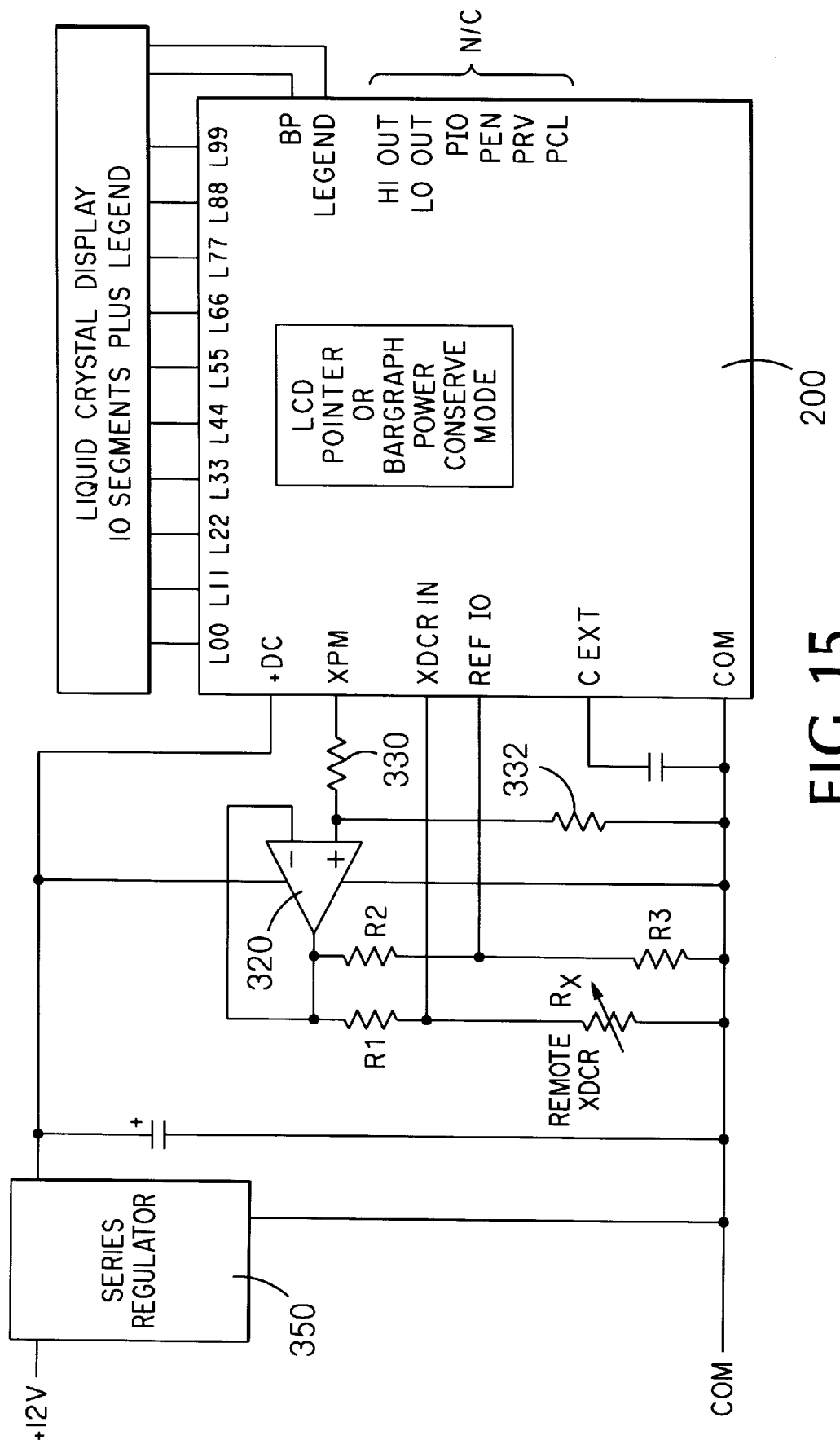
FIGS. 15–17 are block/schematic diagrams showing alternative auxiliary elements used with the semiconductor device.
Figure 16:
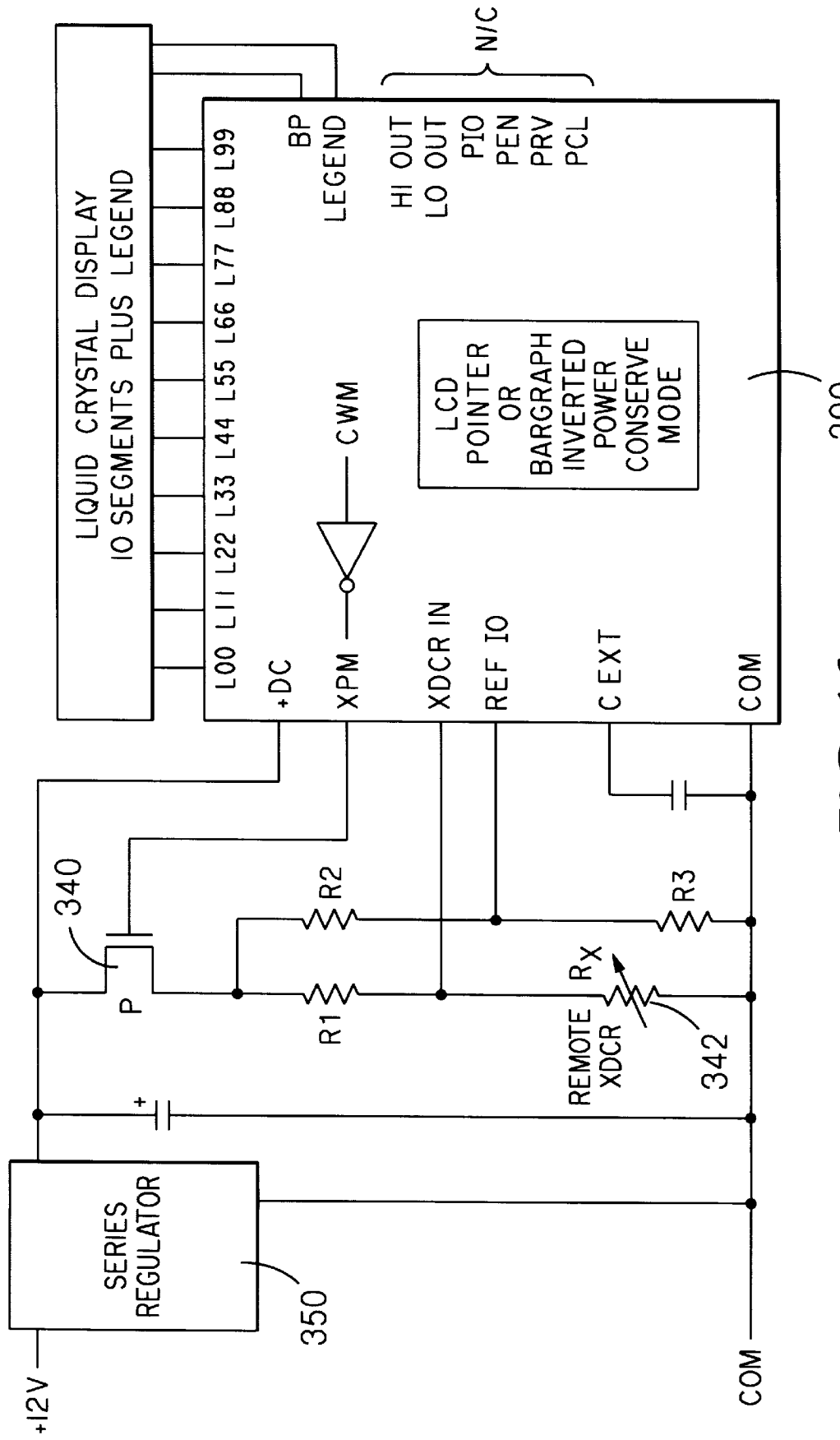

Continuing to refer to FIGS. 8A–C, the CWM signal is then buffered and presented externally as XPM (transducer power modulation). Typically, this will be used in applications where power conservation is mandatory such as: high ambient temperature; very low transducer resistance; heat dissipation restrictions in "micro-instruments"; portable battery operation; etc. Generally, this will be used with relatively fast filter time constants, because the signal must achieve approximate stabilization within the pulse's width. In this example, a maximum time constant on the order of 90 milliseconds is recommended to keep the error under around ½% or 70 milliseconds to keep the error under around 1/10%. The circuit is completed by using an external buffer amplifier 320 as shown in FIG. 15. To further improve power conservation, the output from XPM is divided down by the resistor pair 330/332. This also allows "headroom" for buffer amplifier 202 to operate when powered from the same supply voltage (+DC) as semiconductor device 200. FIG. 16 shows another variant where XPM is inverted and directly drives an external low resistance P channel FET 340, thus allowing drive of a grounded resistive transducer 342 with only one external component in a ⅛ duty cycle power conserving mode. On both FIGS. 15 and 16, the loads have been removed from "HI OUT" and "LO OUT" and a liquid crystal display is used for maximum reduction in power consumption.

On both FIGS. 15 and 16 a series regulator 350 replaces the simple Zener diode shunt regulator in order to realize the gains achievable with the transducer power modulation (by allowing the total input current to drop during the modulator "off" time).

Figure 17:
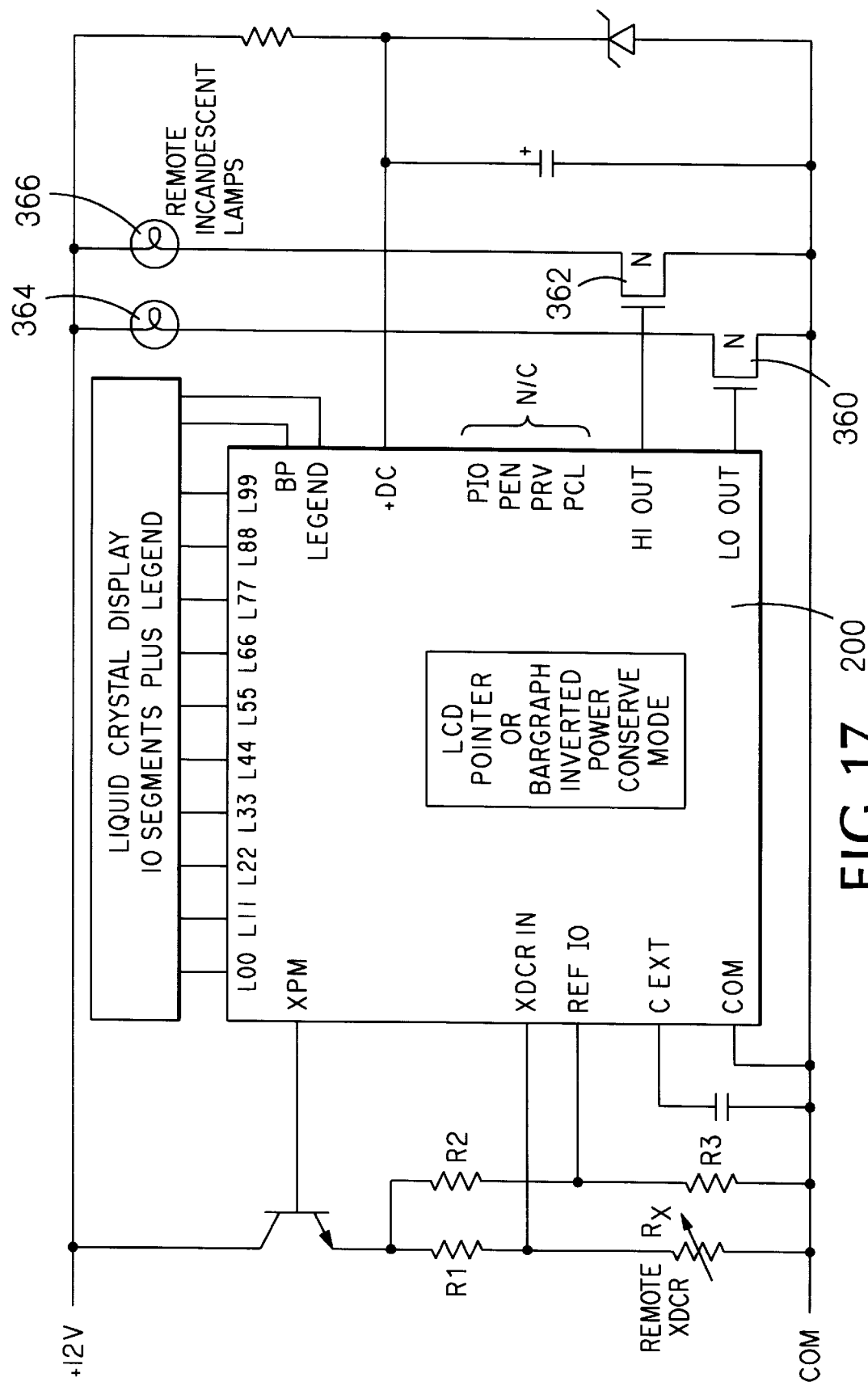

FIG. 17 shows a low power shunt regulator alternative with a relatively high current emitter follower transducer driver and N channel MOSFET lamp drivers 360 and 362. This configuration allows a rather low power "micro-instrument" to drive low impedance off-board loads, such as incandescent lamps 364 and 366. All high current paths draw directly from unregulated power.

Figure 18:
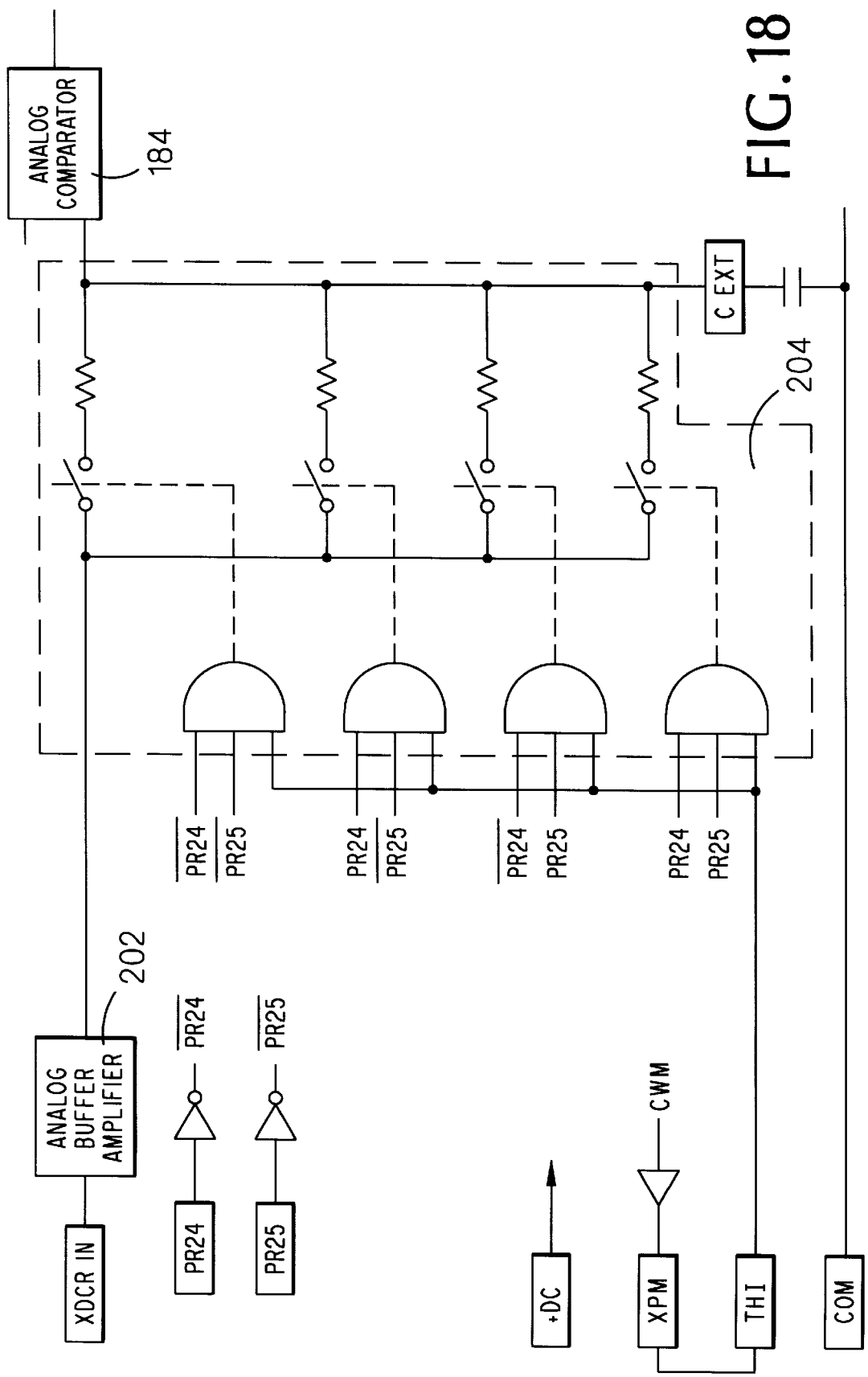
FIG. 18 is a block/schematic diagram showing input switching circuitry for use when the present invention is in a power conservation mode.

FIG. 18 illustrates an implementation in which, when operating in the power conservation mode, it is possible to maintain relatively long filter response times while maintaining relatively decent accuracy by operating the filter in a track-and-hold manner. If, for example, we assume that the maximum sample-to-sample parameter change is on the order of 5%, the settling time to get within ½% will be 2.3 time constants rather than the 5.3 time constants required for a 100% step change ($e^{-2.3}$ around 0.10,×5%=0.5%; $e^{-5.3}$ around 0.005,×100%=0.5%). Therefore, the filter could be 2.3 times longer (slower by 5.3/2.3=2.3) for the same effective accuracy. This modification can be implemented by inserting a fifth state into the integrated switched resistor array 204 which is under control of the CWM signal. When CWM is low, the resistor switches are forced open, thus eliminating the discharge path back through the output of analog buffer amplifier 202. The input impedance of the analog comparator is assumed to be infinite. THI is the track/hold input. It is jumpered to +DC for full time tracking or to XPM for hold during CWM low and track during CWM high. This could be programmed in non-volatile memory 220. The other elements of digital-to-analog converter 170 operate as previously described.

Continuing to refer to FIGS. 8A–C, level decoder 210 compares the converted data to the nine stored thresholds (T11 thru T99 in memory 220) and places that data within one of ten possibilities. These possibilities are a function of: firstly, the nine stored thresholds; secondly, whether or not there is hysteresis, and thirdly, whether the input function is normal or inverted. CAL 8 controls hysteresis, with a logical "1" commanding hysteresis to be active. CAL 7 controls the normal/invert functions, with logical "1" indicating the normal mode. When hysteresis is "on", the threshold is shifted down by one bit after passing up through the threshold in order to prevent dithering when the input signal resides at that threshold. Alternatively, this function could be incorporated within conversion circuitry 170. When hysteresis is "off," no threshold shift occurs.

In the normal mode, the L00 output is controlled by converted values less than T11, whereas in the inverted mode it is controlled by converted values greater than T11. at the other end of the scale a similar inversion occurs, where in the normal mode the L99 output is controlled by converted values equal to or greater than T99, but, in the inverted mode, it is controlled by converted values equal to or less than T99. FIG. 19 is an output driver truth table which illustrates the normal/invert function relative to the display functions of a pointer/bar graph. The example shows a linear 0-to-(+X) volts function which is the normal mode, and a linear (+X)-to-0 volts function which is the inverted mode. The range is assumed to comprise 10 evenly spaced converted values of 25 each for a total of 250.

With respect to zero protection limit and positive protection limit: There are physical protection limits at "XDCR IN" which prevent damage to semiconductor device 200 in the event of input overshoot or undershoot, provided the input current is limited to a sub latchup value (typically 10 to 100 MA depending upon the input protection design). In addition, there are overflow and underflow limits within analog-to-digital converter 170 to prevent the creation of illegal numbers (due to rollovers) outside of the range of 0 to 255.

Figure 22:
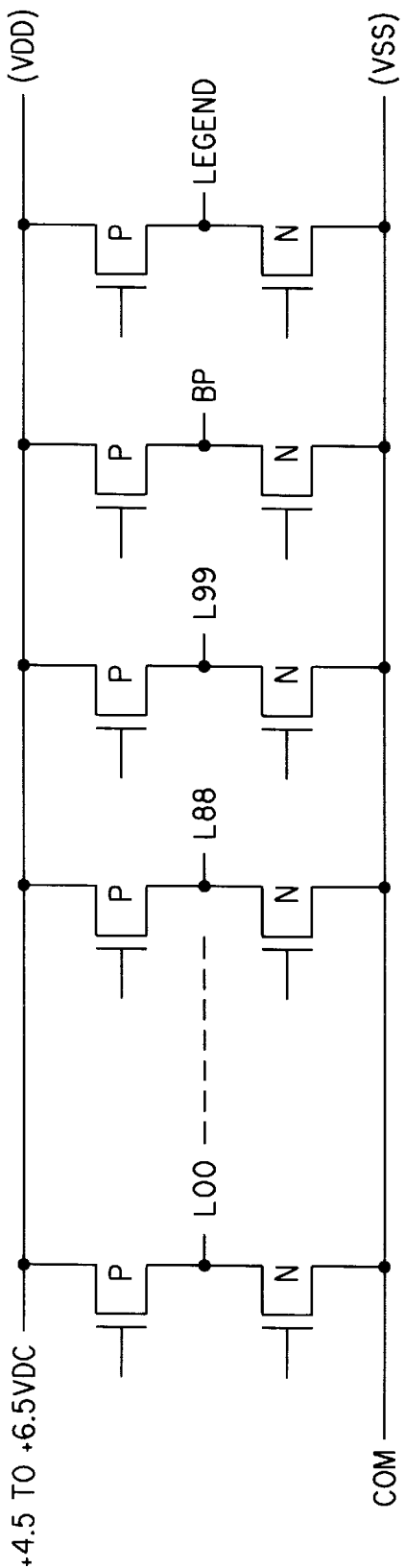
Figure 23:
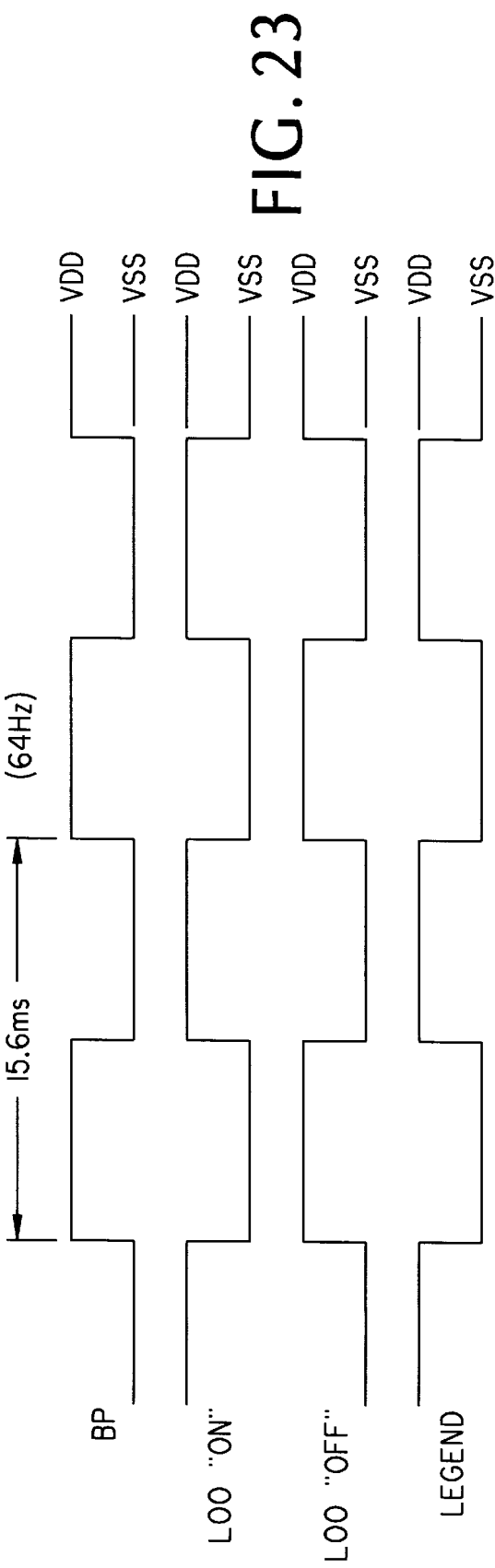
FIG. 23 comprises waveforms showing the "ON" and "OFF" states of a segment (pointer) driver and the "ON" state of a legend driver relative to a back plane driver.

Drive mode generator 212 conditions the 10 zones of decoded data into forms needed for the 10 LCD or LED drivers. Memory location PR21 selects the LED or LCD mode, and memory location PR22 selects the pointer or bargraph mode. C11 provides the 64-Herz reference for generating the direct drive LCD waveforms. FIG. 20 shows the output drivers operating an LED pointer display, FIG. 21 shows the drivers operating an LED bargraph display, and FIG. 22 shows the drivers and their connection destinations to a 10 segment plus legend LCD display. FIG. 23 shows the LCD waveforms for the ever-present legend driver and a typical segment in its "on" and "off" states relative to the ever-present back plane driver. In the pointer mode, one and only one output driver is active at any time. In the bargraph mode, all drivers from L00 through the presently decoded zone are active at that time. These modes are summarized in the table on FIG. 19.

L88 and L99 come under additional control via an upper flasher 400 which is itself under control of memory locations PR11, PR12, and the 2-Herz reference from C16. There are four upper flashing modes defined by the upper flasher truth table on FIG. 24. When flashing is required, the output is modulated by C16 or C16.

L11 and L00 come under additional control via a lower flasher 402 which is itself under control of memory locations PR13, PR14, and the 2-Herz reference from C16. There are four lower flashing modes defined by the lower flasher truth table on FIG. 25. When flashing is required, the output is modulated by C16 or C16.

An upper output 420 ("HI OUT") is under direct control of the upper two decoded levels and memory locations PR15 and PR16. This output signal is independent from the nature of the output drivers L88 and L99 (i.e. LED versus LCD, pointer versus bargraph, flashing mode). There are four "HI OUT" functional modes as described in the HI out truth table on FIG. 26.

A lower output 430 ("LO OUT") is under direct control of the lower two decoded levels and memory locations PR17 and PR18. This output signal is independent from the nature of the output drivers L00 and L11 (i.e., LED versus LCD, pointer versus bargraph, flashing mode). There are four "LO OUT" functional modes as described in the LO out truth table on FIG. 27.

Figure 28:
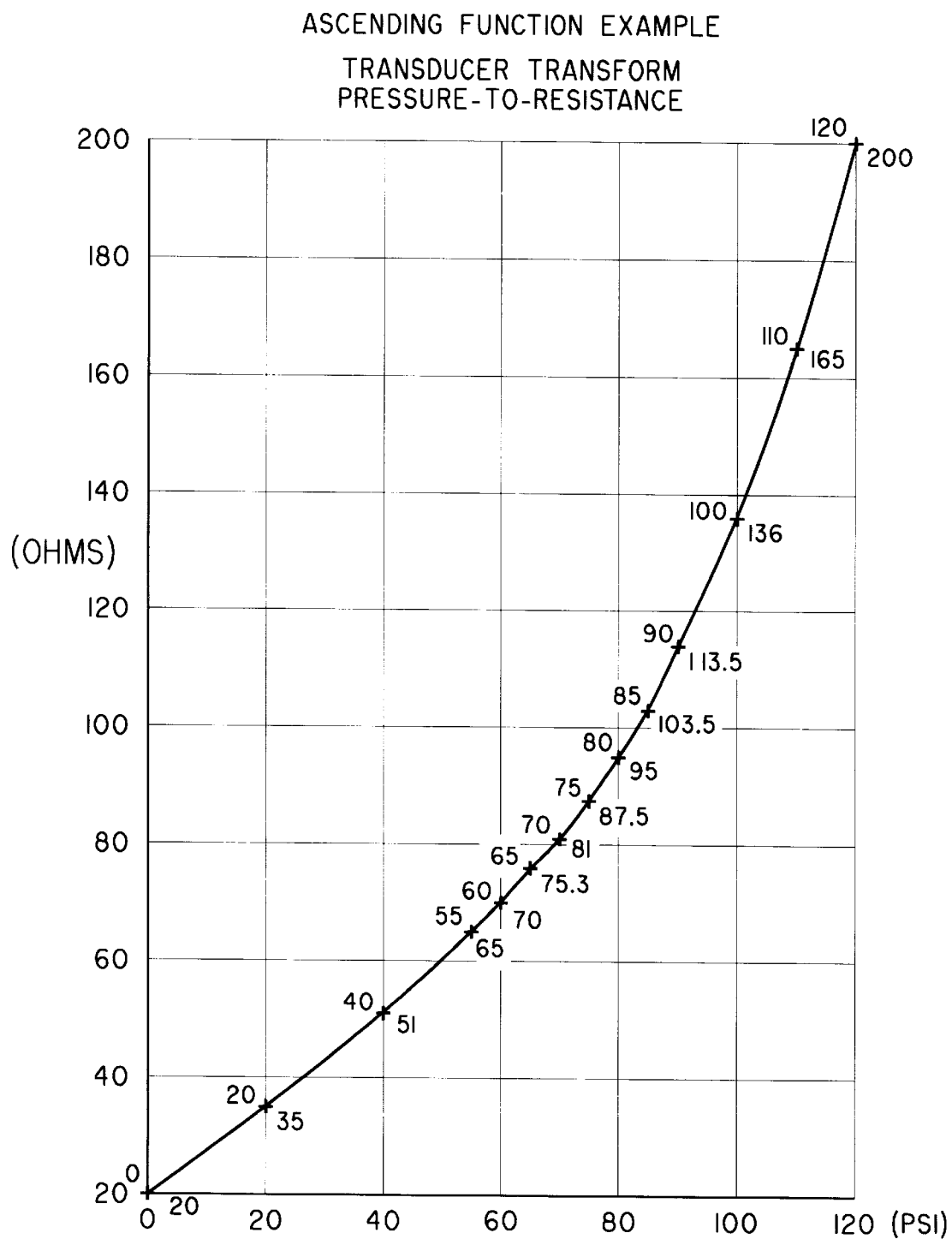
FIG. 28 shows the resistance/pressure relationship of a non-linear resistive transducer.
Figure 29:
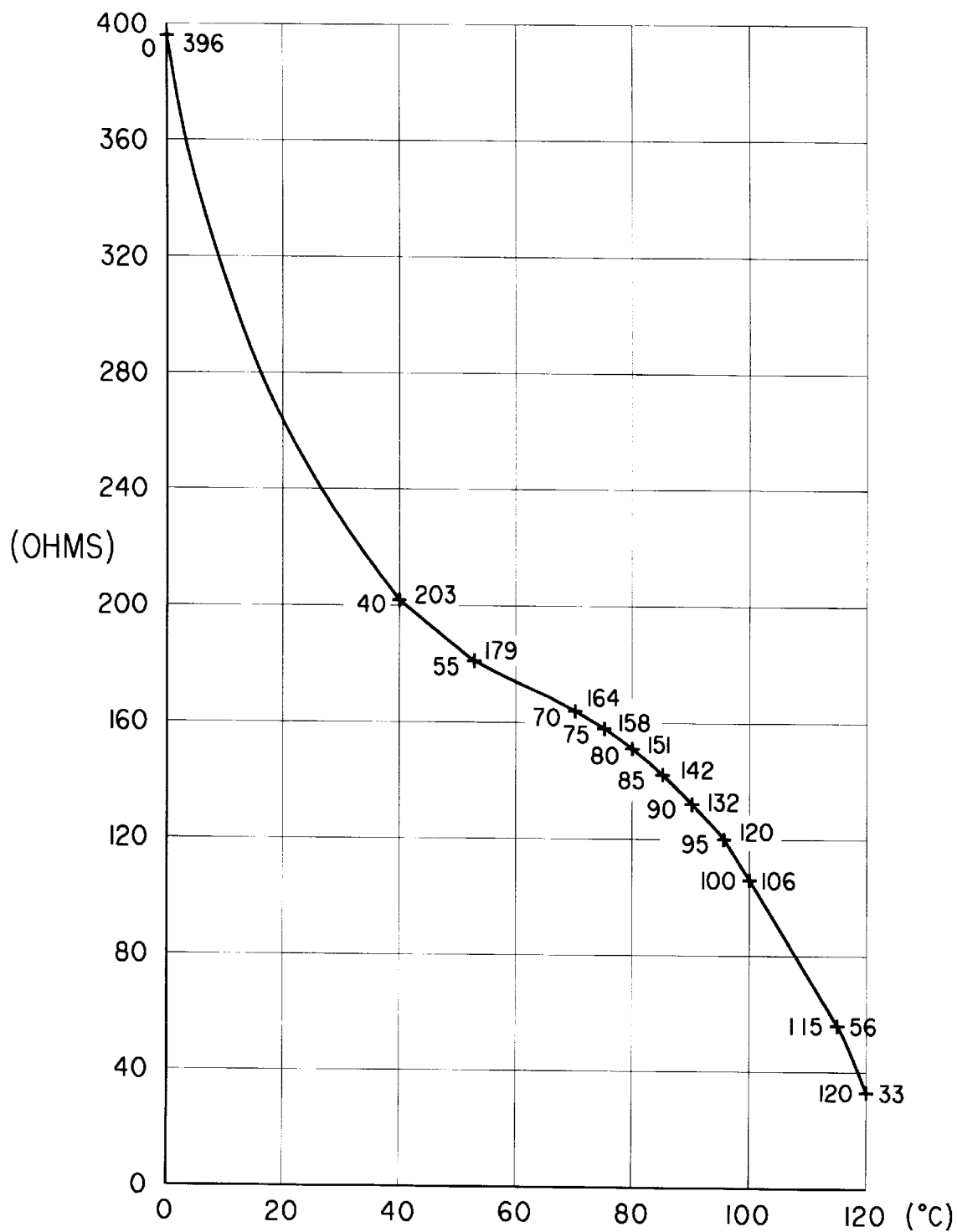
FIG. 29 shows the resistance/temperature relationship of a two non-linear resistive transducer.
Figure 30:
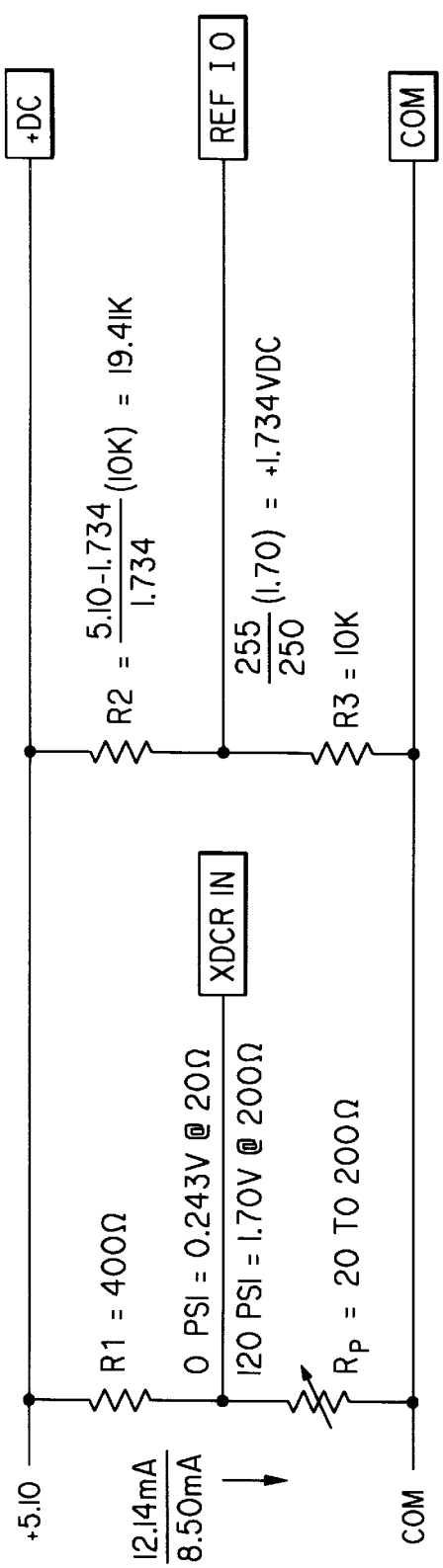
FIG. 30 is a schematic diagram of the input circuitry associated with the transducer of FIG. 28.

The final discussion describes the transformation of two non-linear resistive transducer characteristics into two new non-linear display characteristics. The first uses an ascending pressure-to-resistance transducer, as indicated on FIG. 28. The second uses a descending temperature-to-resistance transducer, as indicated on FIG. 29. Each transducer is located in one leg of the input bridges shown on FIGS. 30 ($R_P$) and 31 ($R_T$), respectively. these produce voltage transforms summarized in the tables on FIGS. 32 and 33, respectively.

Figure 31:
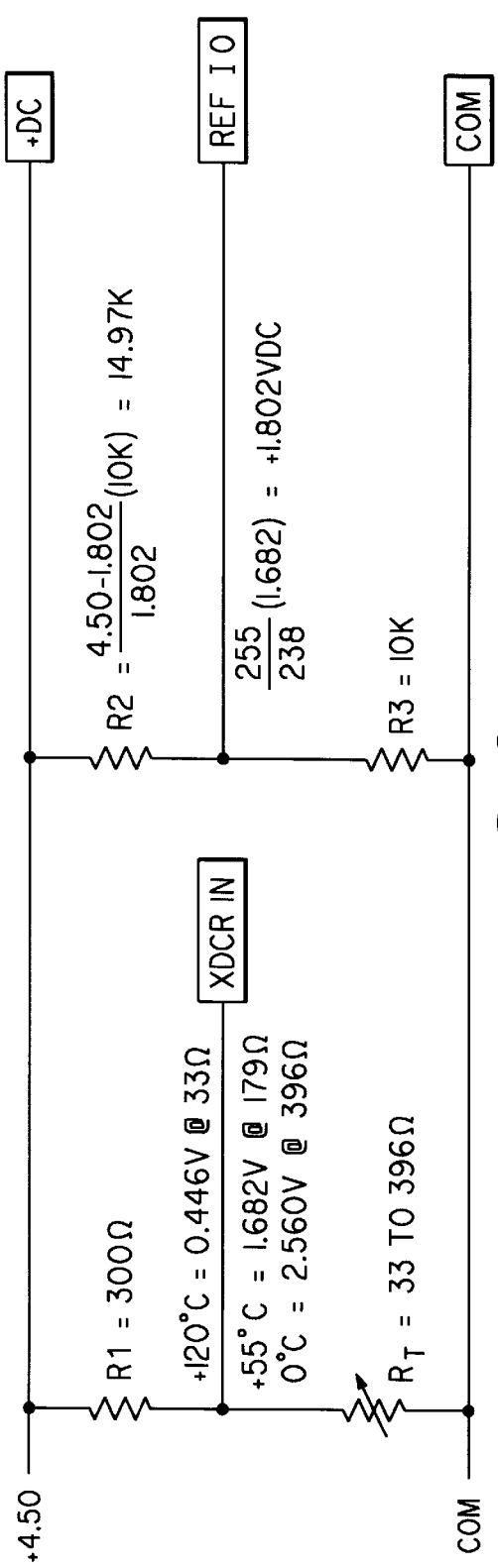
FIG. 31 is a schematic diagram of the input circuitry associated with the transducer of FIG. 29.

The first step in the process entails characterizing the transducer over its complete operating range, paying particular attention to the regions of primary interest (usually expansion and alarm regions). The second step involves the choice of driving mode, e.g., current source, voltage source, voltage source through an impedance, etc. In these examples, the transducers are characterized resistive transducers ($R_T$), and the source is voltage through a series resistance. The series resistor (R1) is selected to produce an arbitrary full range voltage compatible with the "XDCR IN" capability while maintaining the desired resolution and accuracy for the task. If the unit is to be made to operate in the ratio mode, the other half of the bridge (R2 and R3) must be calculated to produce a reference compatible with the range, resolution, and accuracy desired. Note in these examples, the "REF IO" is approximately at full scale relative to the transducer's maximum output voltage in the bridge shown on FIG. 30, but is at only approximately 70% of the transducer's maximum output in the bridge shown on FIG. 31. The 70% truncation is done to improve accuracy and resolution, by allowing the analog-to-digital conversion process to overrange and limit at 255 for values beyond the last programmed threshold. If the same strategy had been applied to FIG. 30, a truncation limit of approximately 80% could have been used with a 4% safety margin. Truncation at the lower voltage end of the scale is also possible, but, in these examples, it would have required means beyond the practical lowest cost solution illustrated.

The third step entails calculating the "XDCR IN" voltages at each of the desired output transitions. For example, in the table on FIG. 32, the 100 pounds-persquare-inch-voltage is equal to $[(136)/(136+400)] \times (5.10)+1.294$ volts. The fourth step converts this voltage to a decimal number, and ultimately its equivalent binary number for insertion into non-volatile memory 220. Again referring to FIG. 32 and 100 pounds per square inch, T99 is equal to $[(1.294)/(1.734)] \times (255)=190.3$ (round off to 190).

The personality of the instrument is then completed by loading all of the functional and calibration instructions into non-volatile memory 220. The table on FIG. 34 summarizes a completely filled memory for the example defined by FIGS. 28, 30, and 32.

Figure 35:
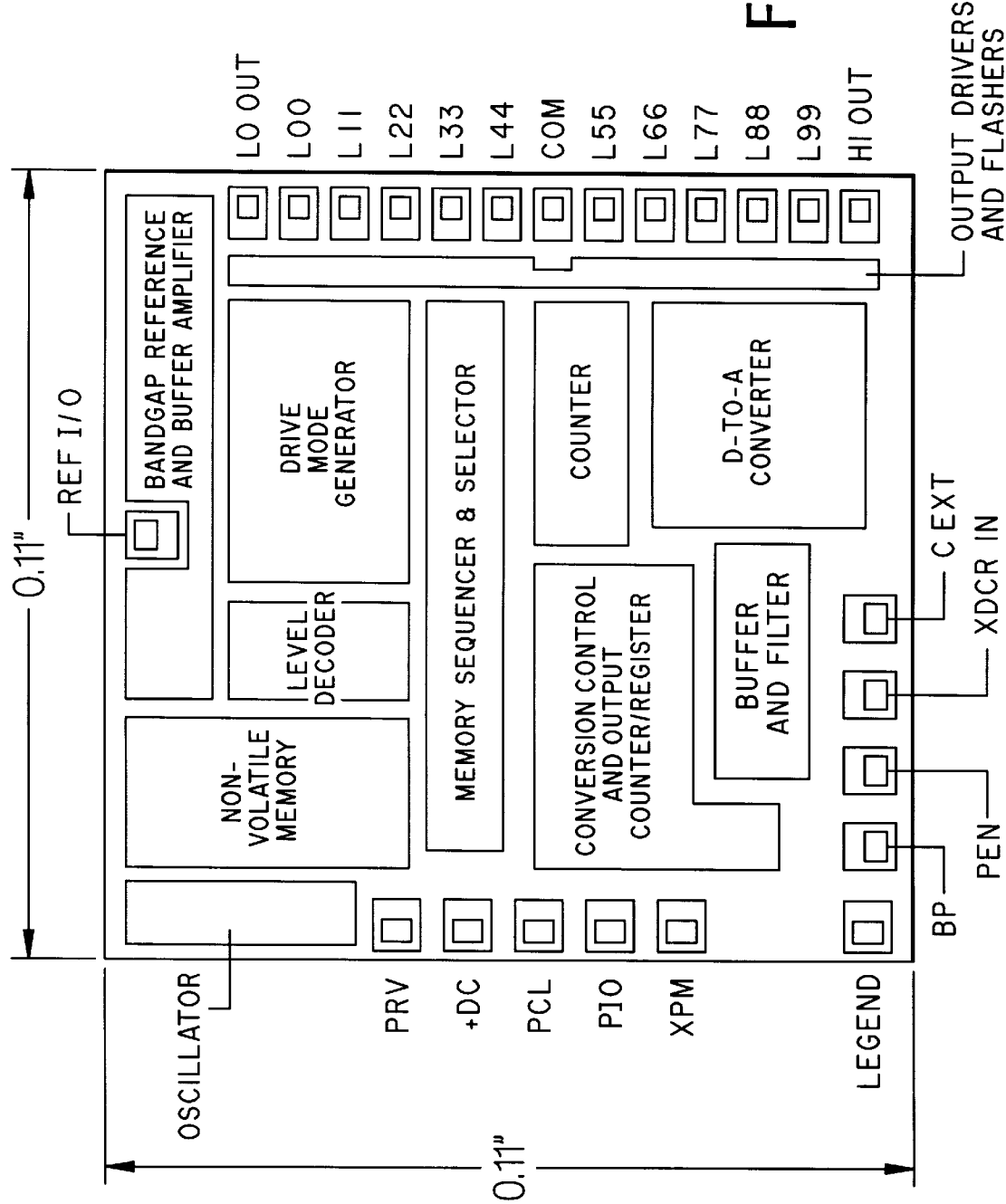
FIG. 35 is a top plan view of a single-chip CMOS implementation of the present invention.

FIG. 35 illustrates schematically the layout of a single-chip CMOS implementation of the present invention, generally indicated by the reference numeral 500, which includes all the analog, digital, and memory elements shown on FIGS. 8A, 8B, and 8C. Chip 500 has external height and width dimensions of about 0.11 inch by 0.11 inch, with bonding pads measuring about 0.004 inch by 0.004 inch. The manufacturing cost of chip 500 is $1.00 or less, using 1996 costs.

In most cases, most, if not all, of the foregoing programming will be completed by the instrument manufacturer; however, programming can also be accomplished at the user level.

Figure 36:
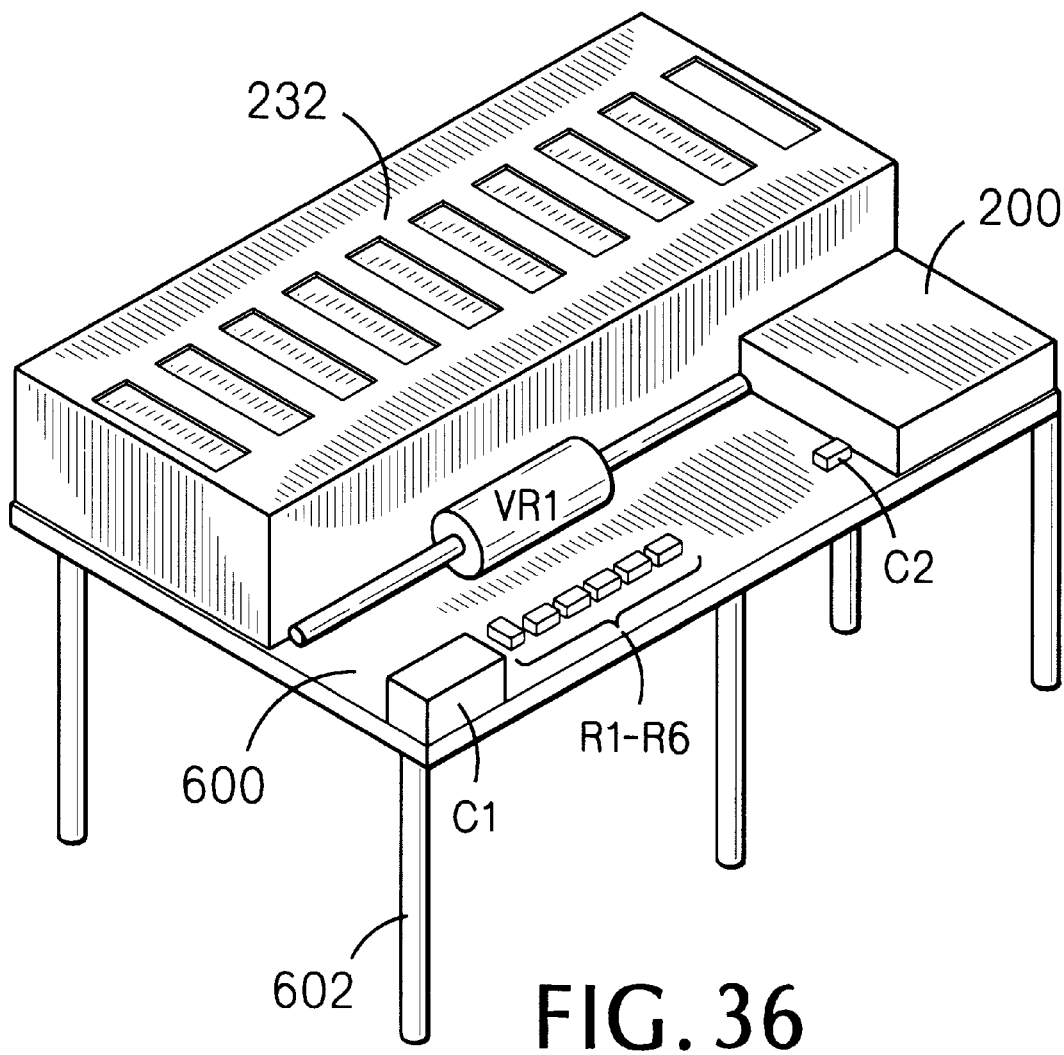
FIGS. 36–38 are isometric, top plan, and side elevational views, respectively, of an instrument package incorporating the embodiment of the present invention shown on FIG. 9.
Figure 37:
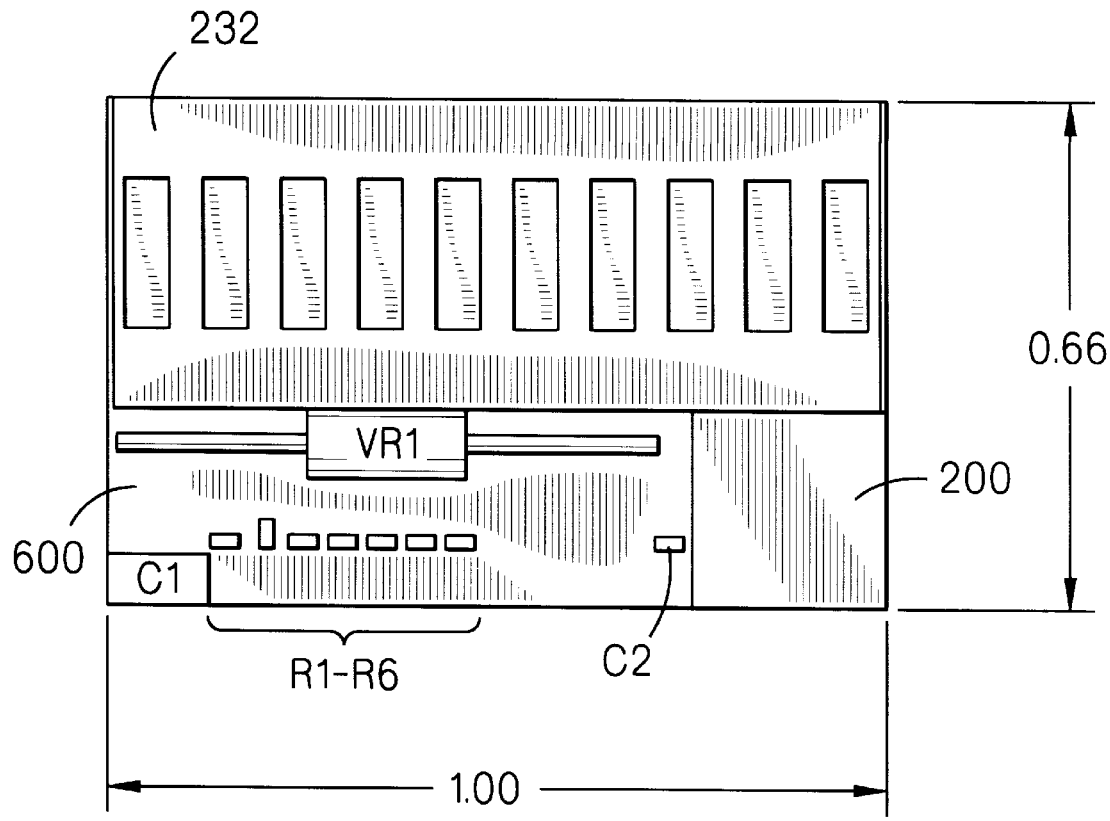
Figure 38:
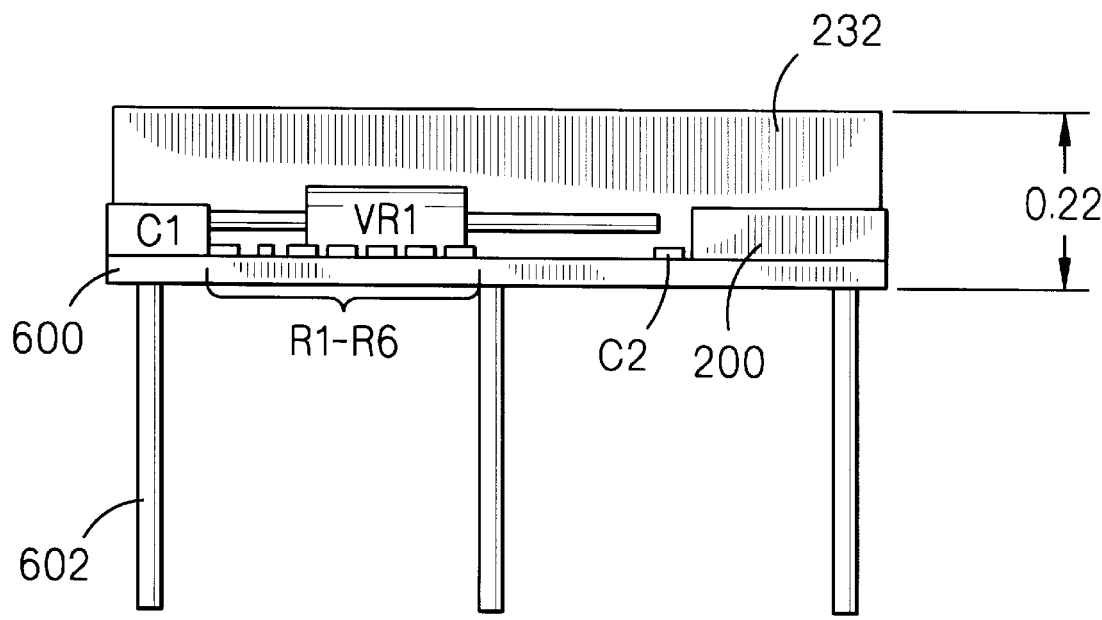

FIGS. 36–38 illustrate the elements of instrument 230 of FIG. 9 in a physical embodiment. The elements are mounted on a thin, horizontal substrate 600 having a plurality of leads, as at 602, depending therefrom. The dimensions given on FIGS. 37 and 38 are in inches. It will be understood that a housing (not shown), if any, will contribute slightly to the overall dimensions of the final package. Of course, many other compact arrangements of the elements are possible. As is discussed above, the package is self-contained and, with only connections to power and transducer $R_x$ can selectively provide a variety of outputs on display 232 from virtually any shape input from the transducer.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. An apparatus for physical measurement and display of a parameter, comprising:

(a) a programmable semiconductor element;

(b) said programmable semiconductor element having means to accept an input signal representative of a value of said parameter, said input signal having arbitrary shape and amplitude;

(c) said programmable semiconductor element having means to provide an output signal to cause a display to display said value of said parameter in an arbitrary shape;

(d) said programmable semiconductor element having means to operate a mating transducer in at least one power conserving mode;

(e) said programmable semiconductor element having means to treat said input signal in one of a normal ascending mode and an inverted descending mode;

(f) said programmable semiconductor element having means to operate in one of an absolute and a ratio mode;

(g) said programmable semiconductor element having means to operate in a selected degree of damping or slew rate control;

(h) said programmable semiconductor element having means to provide at least one over and/or under warning output signal;

(i) said programmable semiconductor element having means to provide said output signal to directly drive at least one light-emitting diode;

(j) said programmable semiconductor element having means to provide said output signal to directly drive light-emitting diodes in one of pointer and bar graph modes;

(k) said programmable semiconductor element having means to provide said output signal to directly drive a liquid crystal display;

(l) said programmable semiconductor element having means to provide said output signal to directly drive a low power liquid crystal display in one of pointer and bar graph modes;

(m) said programmable semiconductor element having means to provide said output signal to drive a continuously operating liquid crystal display;

(n) said programmable semiconductor element having means to provide said output signal to provide color coded status information;

(o) said programmable semiconductor element having means to provide said output signal to provide flashing modes at at least one range limit;

(p) said programmable semiconductor element having means to provide various conversion rate intervals to reduce apparent flicker when a borderline reading is made in a noisy environment;

(q) said programmable semiconductor element having means to introduce hysteresis against said input signal to lessen likelihood of borderline flicker;

(r) said programmable semiconductor element having means to provide for programming all integratable options in a non-volatile memory in said programmable semiconductor element at the time of manufacture of an instrument of which said apparatus is a part;

(s) said programmable semiconductor element having means to operate said apparatus at a low quiescent current while maintaining high current drive capability;

(t) said programmable semiconductor element having means to trim an oscillator in said programmable semiconductor element with instructions from said non-volatile memory in said programmable semiconductor element; and (u) said programmable semiconductor element having means to trim a band gap voltage regulator in said programmable semiconductor element with instructions from said nonvolatile memory in said programmable semiconductor element.

2. An apparatus for physical measurement and display of a parameter, as defined in claim 1, wherein: said programmable semiconductor element has external height and width dimensions not exceeding about 0.11 inch by about 0.11 inch.

3. An apparatus for physical measurement and display of a parameter, as defined in claim 1, wherein: said semiconductor element includes therein integrated digital circuitry, analog circuitry, and nonvolatile memory.

4. A method of physical measurement and display of a parameter, comprising:

(a) providing a programmable semiconductor element;

(b) using said programmable semiconductor element to accept an input signal representative of a value of said parameter, said input signal having arbitrary shape and amplitude;

(c) using said programmable semiconductor element to provide an output signal to cause a display to display said value of said parameter in an arbitrary shape;

(d) using said programmable semiconductor element to operate a mating transducer in at least one power conserving mode;

(e) using said programmable semiconductor element to treat said input signal in one of a normal ascending mode and an inverted descending mode;

(f) using said programmable semiconductor element to operate in one of an absolute and a ratio mode;

(g) using said programmable semiconductor element to operate in a selected degree of damping or slew rate control;

(h) using said programmable semiconductor element to provide at least one over and/or under warning output signal;

(i) using said programmable semiconductor element to provide said output signal, of element (c), to directly drive at least one light-emitting diode;

(j) using said programmable semiconductor element to provide said output signal, of element (c), to directly drive light-emitting diodes in one of pointer and bar graph modes;

(k) using said programmable semiconductor element to provide said output signal, of element (c), to directly drive a liquid crystal display;

(l) using said programmable semiconductor element to provide said output signal, of element (c), to directly drive a low power liquid crystal display in one of pointer and bar graph modes;

(m) using said programmable semiconductor element to provide said output signal, of element (c), to drive a continuously operating liquid crystal display;

(n) using said programmable semiconductor element to provide said output signal, of element (c), to provide color coded status information;

(o) using said programmable semiconductor element to provide said output signal, of element (c), to provide flashing modes at at least one range limit;

(p) using said programmable semiconductor element to provide various conversion rate intervals to reduce apparent flicker when a borderline reading is made in a noisy environment;

(q) using said programmable semiconductor element to introduce hysteresis against said input signal to lessen likelihood of borderline flicker;

(r) using said programmable semiconductor element to provide for programming all integratable options in a non-volatile memory in said programmable semiconductor element at the time of manufacture of an instrument of which said programmable semiconductor is a part;

(s) using said programmable semiconductor element to operate said instrument at a low quiescent current while maintaining high current drive capability;

(t) using said programmable semiconductor element to trim an oscillator in said programmable semiconductor element with instructions from said non-volatile memory in said programmable semiconductor element; and (u) using said programmable semiconductor element to trimming a band gap voltage regulator in said programmable semiconductor element with instructions from said nonvolatile memory in said programmable semiconductor element.

5. A method of physical measurement and display of a parameter, as defined in claim 4, further comprising: providing said programmable semiconductor element having external height and width dimensions not exceeding about 0.11 inch by about 0.11 inch.

6. A method of physical measurement and display of a parameter, as defined in claim 4, further comprising: providing said programmable semiconductor element including therein integrated digital circuitry, analog circuitry, and said non-volatile memory.

* * * * *